United States Patent
Arkiszewski et al.

(10) Patent No.: US 12,063,017 B2
(45) Date of Patent: Aug. 13, 2024

(54) MULTI-MODE POWER AMPLIFIER SYSTEM AND RELATED WIRELESS DEVICES AND METHODS

(71) Applicant: Skyworks Solutions, Inc., Irvine, CA (US)

(72) Inventors: Roman Zbigniew Arkiszewski, Oak Ridge, NC (US); Jeffrey Gordon Strahler, Greensboro, NC (US)

(73) Assignee: Skyworks Solutions, Inc., Irvine, CA (US)

(*) Notice: Subject to any disclaimer, the term of this patent is extended or adjusted under 35 U.S.C. 154(b) by 479 days.

(21) Appl. No.: 17/339,735

(22) Filed: Jun. 4, 2021

(65) Prior Publication Data
US 2021/0408985 A1    Dec. 30, 2021

Related U.S. Application Data

(60) Provisional application No. 63/045,586, filed on Jun. 29, 2020.

(51) Int. Cl.
| | |
|---|---|
| *H03F 1/07* | (2006.01) |
| *H03F 3/195* | (2006.01) |
| *H03F 3/24* | (2006.01) |
| *H03F 3/68* | (2006.01) |
| *H03F 3/72* | (2006.01) |

(52) U.S. Cl.
CPC ............. *H03F 3/24* (2013.01); *H03F 3/195* (2013.01); *H03F 3/245* (2013.01); *H03F 3/68* (2013.01); *H03F 3/72* (2013.01); *H03F 2200/111* (2013.01); *H03F 2200/451* (2013.01)

(58) Field of Classification Search
CPC .............................. H03F 1/07; H03F 2200/451
USPC .................................................... 330/126.51
See application file for complete search history.

(56) References Cited

U.S. PATENT DOCUMENTS

| | | |
|---|---|---|
| 6,496,708 B1 | 12/2002 | Chan et al. |
| 7,965,990 B2 | 6/2011 | Luz et al. |
| 9,357,510 B2 | 5/2016 | Damnjanovic et al. |

(Continued)

FOREIGN PATENT DOCUMENTS

| | | |
|---|---|---|
| CN | 110234158 | 9/2019 |
| CN | 110912576 | 3/2020 |

(Continued)

OTHER PUBLICATIONS

U.S. Appl. No. 17/339,778, filed Jun. 4, 2021, Dual Connectivity Power Amplifier System.

*Primary Examiner* — Henry Choe
(74) *Attorney, Agent, or Firm* — Knobbe, Martens, Olson & Bear, LLP

(57) ABSTRACT

Aspects of this disclosure relate to a multi-mode power amplifier system. A first power amplifier is configured to provide a radio frequency signal associated with a different radio access technology in a first mode than in a second mode. A second power amplifier is configured to be active in the first mode such that the first power amplifier and the second power amplifier are concurrently active in the first mode. A switch can electrically connect the output of the first power amplifier to different radio frequency signal path in the first mode than in the second mode. Related methods, power amplifier modules, and wireless communication devices are disclosed.

20 Claims, 13 Drawing Sheets

(56) References Cited

U.S. PATENT DOCUMENTS

| | | | |
|---|---|---|---|
| 9,793,808 B1 * | 10/2017 | Yasuhara | H02M 3/158 |
| 10,368,384 B2 | 7/2019 | Ali et al. | |
| 11,172,413 B2 | 11/2021 | Stojanovski et al. | |
| 2011/0294540 A1 | 12/2011 | Kim | |
| 2013/0316663 A1 | 11/2013 | Kishigami et al. | |
| 2015/0244338 A1 | 8/2015 | Lee et al. | |
| 2018/0227960 A1 | 8/2018 | Belghoul et al. | |
| 2019/0090297 A1 | 3/2019 | Lan et al. | |
| 2019/0158137 A1 | 5/2019 | Brunel et al. | |
| 2020/0076565 A1 | 3/2020 | Lan et al. | |
| 2020/0107279 A1 | 4/2020 | Sun et al. | |
| 2021/0168736 A1 | 6/2021 | Cho et al. | |
| 2021/0408984 A1 | 12/2021 | Arkiszewski et al. | |

FOREIGN PATENT DOCUMENTS

| | | |
|---|---|---|
| CN | 111277296 | 6/2020 |
| CN | 111327344 | 8/2021 |
| EP | 3540960 | 9/2019 |
| KR | 2019-0104874 | 9/2019 |
| WO | WO 2019/188968 | 10/2019 |
| WO | WO 2019/208906 | 10/2019 |

* cited by examiner

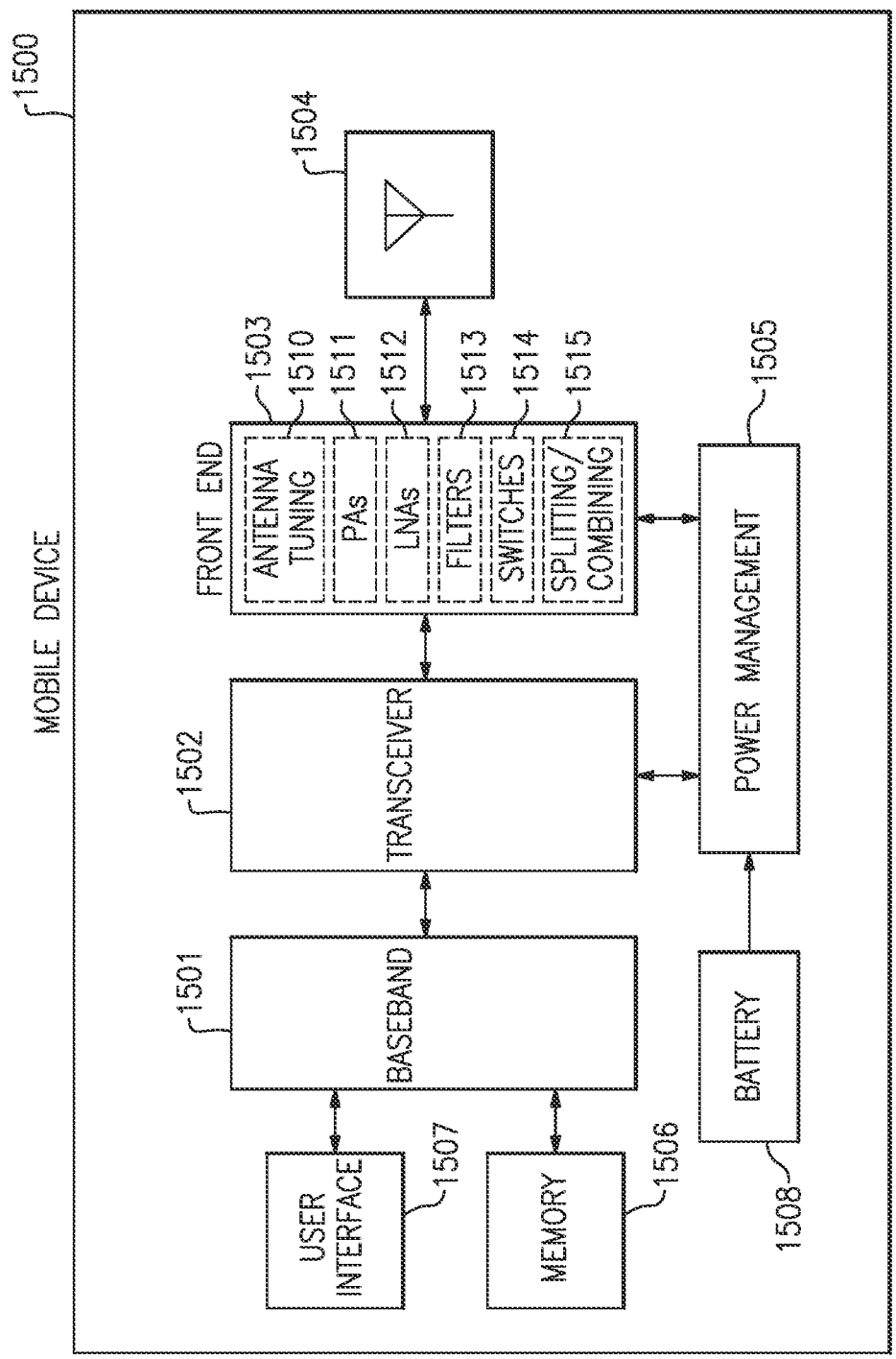

MULTI-MODE POWER AMPLIFIER SYSTEM AND RELATED WIRELESS DEVICES AND METHODS

CROSS REFERENCE TO PRIORITY APPLICATION

This application claims the benefit of priority of U.S. Provisional Application No. 63/045,586, filed Jun. 29, 2020 and entitled "DUAL CONNECTIVITY POWER AMPLIFIER SYSTEM," the disclosure of which is hereby incorporated by reference in its entirety.

BACKGROUND

Technical Field

Embodiments of this disclosure relate to power amplifier systems arranged to transmit radio frequency signals.

Description of Related Technology

Radio frequency (RF) communication systems can be used for transmitting and/or receiving signals of a wide range of frequencies. For example, an RF communication system can be used to wirelessly communicate RF signals in a frequency range of about 30 kilohertz (kHz) to 300 gigahertz (GHz), such as in the range of about 410 megahertz (MHz) to about 7.125 GHz for Fifth Generation (5G) cellular communications in Frequency Range 1 (FR1).

Examples of RF communication systems include, but are not limited to, mobile phones, tablets, base stations, network access points, customer-premises equipment (CPE), laptops, and wearable electronics.

In certain applications, RF communications systems can transmit a plurality of RF signals simultaneously. Radio frequency power amplifiers can be used in amplifying such RF signals for transmission.

SUMMARY OF CERTAIN INVENTIVE ASPECTS

The innovations described in the claims each have several aspects, no single one of which is solely responsible for its desirable attributes. Without limiting the scope of the claims, some prominent features of this disclosure will now be briefly described.

One aspect of this disclosure is a power amplifier system arranged for dual connectivity. The power amplifier system includes a first power amplifier, a second power amplifier, radio frequency processing circuitry, and a switch. The first power amplifier includes an output configured to provide a radio frequency signal. The first power amplifier configured to be active in a dual connectivity mode and to be active in a different mode. The second power amplifier is configured to be active in the dual connectivity mode such that the first power amplifier and the second power amplifier are concurrently active in the dual connectivity mode. The radio frequency front end processing circuitry includes a first radio frequency signal path and a second radio frequency signal path. The switch is configured to electrically connect the output of the first power amplifier to the first radio frequency signal path in the dual connectivity mode and to electrically connect the output of the first power amplifier to the second radio frequency signal path in the different mode.

The different mode can be a cellular communication mode. The radio frequency signal can have a lower power in the dual connectivity mode than in the different mode. The different mode can be a second generation mode. The second power amplifier can be inactive in the different mode.

The dual connectivity mode can be a non-standalone fifth generation mode. The radio frequency signal can be a Long Term Evolution signal in the dual connectivity mode, and the second power amplifier can provide a New Radio signal in the dual connectivity mode. The radio frequency signal can be a New Radio signal in the dual connectivity mode, and the second power amplifier can provide a Long Term Evolution signal in the dual connectivity mode.

The first signal path can be operatively coupled between the switch and a first antenna, and the second signal path can be operatively coupled between the switch and a second antenna. The first antenna can be configured to transmit the first radio frequency signal in the dual connectivity mode, and the second antenna is configured to transmit the second radio frequency signal in the dual connectivity mode.

The power amplifier system can further include an input switch configured to electrically connect a first transmitter to an input of the first power amplifier in the dual connectivity mode, and to electrically connect a second transmitter to the input of the first power amplifier in the different mode.

The power amplifier system can further include a load line coupled to the output of the power amplifier, in which the load line can provide a first impedance in the dual connectivity mode and provide a second impedance in the different mode.

The first power amplifier can have a larger bandwidth in the dual connectivity mode than in the different mode.

Another aspect of this disclosure is a method of transmitting radio frequency signals. The method includes generating a first radio frequency signal in a dual connectivity mode using a first power amplifier; generating a second radio frequency signal in the dual connectivity mode using a second power amplifier; wirelessly transmitting the first radio frequency signal and the second radio frequency signal in the dual connectivity mode; changing a mode of operation from the dual connectivity mode to a different mode, the first power amplifier mode being active in the different mode; and electrically connecting an output of the first power amplifier to a different radio frequency signal path for the different mode than for the dual connectivity mode.

The first and second radio frequency signals can be uplink signals. The wirelessly transmitting can include transmitting the first radio frequency signal from a first antenna and wirelessly transmitting the second radio frequency signal from a second antenna in the dual connectivity mode. The method can include deactivating the second power amplifier for the different mode.

Another aspect of this disclosure is a wireless communication device arranged for dual connectivity. The wireless communication device includes a first power amplifier, a second power amplifier, and a plurality of antennas. The first power amplifier includes an output configured to provide a first radio frequency signal. The first power amplifier is configured to be active in a dual connectivity mode and to be active in a different mode. The second power amplifier configured to be active in the dual connectivity mode such that the first power amplifier and the second power amplifier are concurrently active in the dual connectivity mode. The plurality of antennas includes a first antenna and a second antenna. The first antenna is configured to transmit the first radio frequency signal in the dual connectivity mode. The second antenna is configured to transmit the second radio frequency signal in the dual connectivity mode.

The wireless communication can include radio frequency front end processing circuitry including a first radio frequency signal path and a second radio frequency signal path, and a switch configured to electrically connect the output of the first power amplifier to the first radio frequency signal path in the dual connectivity mode and to electrically connect the output of the first power amplifier to the second radio frequency signal path in the different mode.

The first radio frequency signal can be a Long Term Evolution signal in the dual connectivity mode, and the second radio frequency signal can be a New Radio signal in the dual connectivity mode. The first radio frequency signal can be a New Radio signal in the dual connectivity mode, and the second radio frequency signal can be a Long Term Evolution signal in the dual connectivity mode.

The different mode can be associated with a different radio access technology than radio access technologies associated with the dual connectivity mode.

The second power amplifier can be inactive in the different mode. The different mode can be a second generation mode.

The second antenna can be in communication with an output of the first power amplifier in the different mode. Alternatively, a third antenna of the plurality of antennas can be in communication with an output of the first power amplifier in the different mode.

The wireless communication device can be a mobile phone.

Another aspect of this disclosure is a power amplifier system that includes a first power amplifier, a second power amplifier, and a switch. The first power amplifier is configured to be active in a first mode and to be active in a second mode. The first power amplifier includes an output configured to provide a radio frequency signal associated with a different radio access technology in the first mode than in the second mode. The second power amplifier is configured to be active in the first mode such that the first power amplifier and the second power amplifier are concurrently active in the first mode. The switch is configured to electrically connect the output of the first power amplifier to a first radio frequency signal path in the first mode and to electrically connect the output of the first power amplifier to a second radio frequency signal path in the second mode.

The first mode can be a dual connectivity mode. The first mode can be a carrier aggregation mode. The first mode can be a multiple-input multiple-output mode.

The radio frequency signal can be associated with a fourth generation technology in the first mode and a second generation technology in the second mode. The radio frequency signal can be associated with a fifth generation technology in the first mode and a second generation technology in the second mode.

The second power amplifier can be inactive in the second mode. The second mode can be a second generation mode.

The power amplifier system can include radio frequency front end processing circuitry that includes the first radio frequency signal path and the second radio frequency signal path.

Another aspect of this disclosure is a wireless communication device arranged for multiple modes. The wireless communication device includes a first power amplifier, a second power amplifier, and a plurality of antennas. The first power amplifier is configured to be active in a first mode and to be active in a second mode. The first power amplifier includes an output configured to provide a first radio frequency signal associated with a different radio access technology in the first mode than in the second mode. The second power amplifier is configured to be active in the second mode. The plurality of antennas includes a first antenna and a second antenna. The first antenna is configured to transmit the first radio frequency signal from the first power amplifier in the first mode. The second antenna is configured to transmit a second radio frequency signal from the second power amplifier in the first mode.

The wireless communication device can include radio frequency front end processing circuitry including a first radio frequency signal path and a second radio frequency signal path, and a switch configured to electrically connect the output of the first power amplifier to the first radio frequency signal path in the first mode and to electrically connect the output of the first power amplifier to the second radio frequency signal path in the second mode.

The first mode can be a dual connectivity mode. The first mode can be a multiple input multiple-output mode.

The first radio frequency signal can be associated with a first cellular radio access technology in the first mode, and the second radio frequency signal can be associated with a second radio access technology in the first mode, where the second radio access technology being different than the first radio access technology. The first radio frequency signal can be a Long Term Evolution signal in the first mode, and the first radio frequency signal can be a second generation technology signal in the second mode. The first radio frequency signal can be a New Radio signal in the first mode, and the first radio frequency signal can be a second generation technology signal in the second mode.

The first antenna can be in communication with an output of the first power amplifier in the second mode. The second antenna can be in communication with an output of the first power amplifier in the second mode. A third antenna of the plurality of antennas can be in communication with an output of the first power amplifier in the second mode.

Another aspect of this disclosure is a method of generating radio frequency signals. The method includes generating radio frequency signals in a first mode using a first power amplifier and a second power amplifier that are concurrently active; and activating the first power amplifier for radio signal amplification in a second mode, the power amplifier providing radio frequency signal amplification associated with a different radio access technology in the second mode than the first mode.

The first mode can be a dual connectivity mode, and the second mode can be a second generation (2G) mode.

The method can include electrically connecting an output of the first power amplifier to a first signal path for the first mode, and electrically connecting the output of the first power amplifier to a second signal path for the second mode.

The method can include deactivating the second power amplifier for the different mode.

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

The present disclosure relates to U.S. patent application Ser. No. 17/339,778, titled "DUAL CONNECTIVITY POWER AMPLIFIER SYSTEM," filed on even date herewith, the entire disclosure of which is hereby incorporated by reference herein.

BRIEF DESCRIPTION OF THE DRAWINGS

Embodiments of this disclosure will now be described, by way of non-limiting example, with reference to the accompanying drawings.

FIG. 15 is a schematic diagram of one embodiment of a mobile device.

DETAILED DESCRIPTION OF CERTAIN EMBODIMENTS

Figure 1:
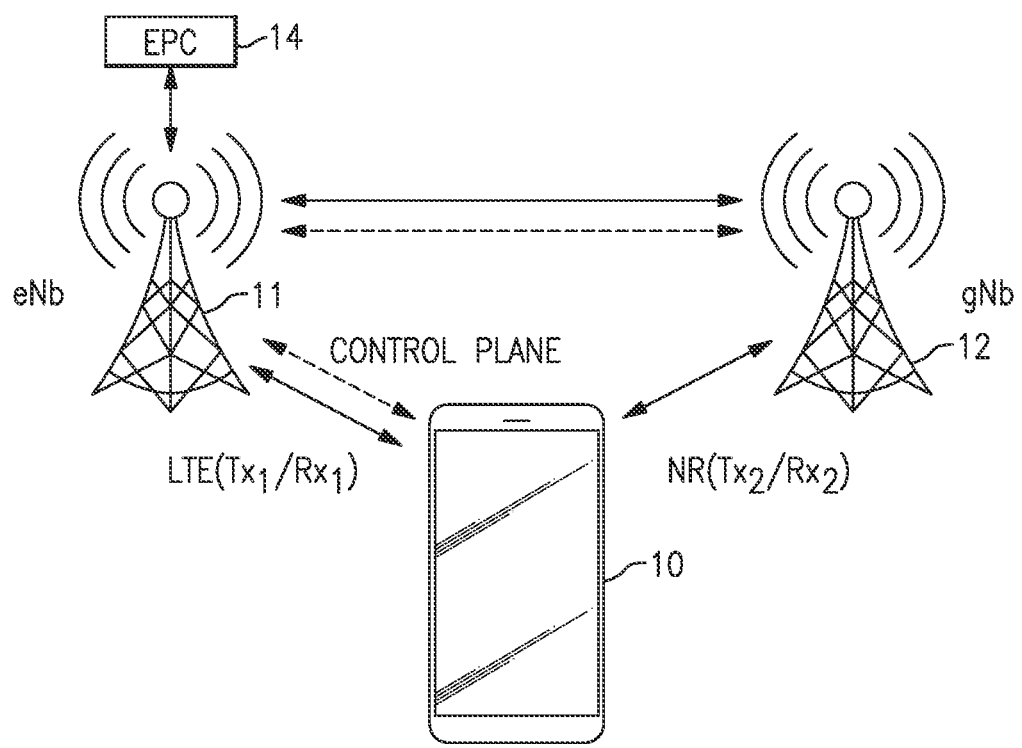
FIG. 1 is a diagram of an example dual connectivity network topology.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings. The headings provided herein are for convenience only and are not intended to affect the meaning or scope of the claims.

The International Telecommunication Union (ITU) is a specialized agency of the United Nations (UN) responsible for global issues concerning information and communication technologies, including the shared global use of radio spectrum.

The 3rd Generation Partnership Project (3GPP) is a collaboration between groups of telecommunications standard bodies across the world, such as the Association of Radio Industries and Businesses (ARIB), the Telecommunications Technology Committee (TTC), the China Communications Standards Association (CCSA), the Alliance for Telecommunications Industry Solutions (ATIS), the Telecommunications Technology Association (TTA), the European Telecommunications Standards Institute (ETSI), and the Telecommunications Standards Development Society, India (TSDSI).

Working within the scope of the ITU, 3GPP develops and maintains technical specifications for a variety of mobile communication technologies, including, for example, second generation (2G) technology (for instance, Global System for Mobile Communications (GSM) and Enhanced Data Rates for GSM Evolution (EDGE)), third generation (3G) technology (for instance, Universal Mobile Telecommunications System (UMTS) and High Speed Packet Access (HSPA)), and fourth generation (4G) technology (for instance, Long Term Evolution (LTE) and LTE-Advanced).

The technical specifications controlled by 3GPP can be expanded and revised by specification releases, which can span multiple years and specify a breadth of new features and evolutions.

In one example, 3GPP introduced carrier aggregation (CA) for LTE in Release 10. Although initially introduced with two downlink carriers, 3GPP expanded carrier aggregation in Release 14 to include up to five downlink carriers and up to three uplink carriers. Other examples of new features and evolutions provided by 3GPP releases include, but are not limited to, License Assisted Access (LAA), enhanced LAA (eLAA), Narrowband Internet of things (NB-IOT), Vehicle-to-Everything (V2X), and High Power User Equipment (HPUE).

3GPP introduced Phase 1 of fifth generation (5G) technology in Release 15, and is currently in the process of developing Phase 2 of 5G technology in Release 16. Subsequent 3GPP releases will further evolve and expand 5G technology. 5G technology is also referred to herein as 5G New Radio (NR).

5G NR supports or plans to support a variety of features, such as communications over millimeter wave spectrum, beamforming capability, high spectral efficiency waveforms, low latency communications, multiple radio numerology, and/or non-orthogonal multiple access (NOMA). Although such RF functionalities offer flexibility to networks and enhance user data rates, supporting such features can pose a number of technical challenges.

The teachings herein are applicable to a wide variety of communication systems, including, but not limited to, communication systems using advanced cellular technologies, such as LTE-Advanced, LTE-Advanced Pro, and/or 5G NR.

Dual Connectivity

With the introduction of the 5G NR air interface standards, 3GPP has allowed for the simultaneous operation of 5G and 4G standards in order to facilitate the transition. This mode can be referred to as Non-Stand-Alone (NSA) 5G operation or E-UTRAN New Radio-Dual Connectivity (EN-DC) and involves both 4G and 5G carriers being simultaneously transmitted from a user equipment (UE).

In certain EN-DC applications, dual connectivity NSA involves overlaying 5G systems onto an existing 4G core network. For dual connectivity in such applications, the control and synchronization between the base station and the UE can be performed by the 4G network while the 5G network is a complementary radio access network tethered to the 4G anchor. The 4G anchor can connect to the existing 4G network with the overlay of 5G data/control.

FIG. 1 is a diagram of an example dual connectivity network topology. This architecture can leverage LTE legacy coverage to ensure continuity of service delivery and the progressive rollout of 5G cells. A UE 10 can simultaneously transmit dual uplink LTE and NR carrier. The UE 10 can transmit an uplink LTE carrier Tx1 to the eNB 11 while transmitting an uplink NR carrier Tx2 to the gNB 12 to implement dual connectivity. Any suitable combination of uplink carriers Tx1, Tx2 and/or downlink carriers Rx1, Rx2 can be concurrently transmitted via wireless links in the example network topology of FIG. 1. The eNB 11 can provide a connection with a core network, such as an Evolved Packet Core (EPC) 14. The gNB 12 can communicate with the core network via the eNB 11. Control plane data can be wireless communicated between the UE 10 and eNB 11. The eNB 11 can also communicate control plane data with the gNB 12. Control plane data can propagate along the paths of the dashed lines in FIG. 1. The solid lines in FIG. 1 are for data plane paths.

In the example dual connectivity topology of FIG. 1, any suitable combinations of standardized bands and radio access technologies (e.g., FDD, TDD, SUL, SDL) can be wirelessly transmitted and received. This can present technical challenges related to having multiple separate radios and bands functioning in the UE 10. With a TDD LTE anchor point, network operation may be synchronous, in which case the operating modes can be constrained to Tx1/Tx2 and Rx1/Rx2, or asynchronous which can involve Tx1/Tx2, Tx1/Rx2, Rx1/Tx2, Rx1/Rx2. When the LTE anchor is a frequency division duplex (FDD) carrier, the TDD/FDD inter-band operation can involve simultaneous Tx1/Rx1/Tx2 and Tx1/Rx1/Rx2.

As discussed above, EN-DC can involve both 4G and 5G carriers being simultaneously transmitted from a UE. Transmitting both 4G and 5G carriers from a UE, such as a phone, typically involves two power amplifiers (PAs) being active at the same time. Traditionally, having two power amplifiers active simultaneously would involve the placement of one or more additional power amplifiers specifically suited for EN-DC operation. Additional board space and expense is incurred when designing to support such EN-DC/NSA operation.

This disclosure provides systems and methods of supporting EN-DC/NSA operation without adding additional PAs, without consuming more Printed Circuit Board (PCB) space or physical area, and without adding significant expense to the supporting EN-DC/NSA operation.

Early solutions employ additional standalone power amplifiers to support the 4G bands during NSA/EN-DC operation. These additional power amplifiers consume additional PCB space and come with added system cost. As an example, an LTE Band 20 (B20) and NR Band 28 (n28) NSA EN-DC case is typically supported with an additional external low band (LB) EN-DC power amplifier in addition to the LB Power Amplifier Module including Duplexer (PAMiD) module. This solution involves additional PCB space and expense to support the EN-DC case with the extra power amplifier. Another example is the LTE Band 3 (B3) and NR Band 1 (n1) NSA EN-DC case being supported with an additional external Mid Band (MB) EN-DC power amplifier in a Mid Band/High Band (MB/HB) PAMiD module. This solution also involves additional PCB space and expense to support the EN-DC case with the extra power amplifier.

Aspects of this disclosure relate to using an existing power amplifier to implement dual connectivity. The existing power amplifier can be active in a dual connectivity mode and also in a different mode. For example, one or more existing 2G PAs can be used for both 2G and 4G/5G EN-DC applications. 2G PAs are typically included in system implementations as either a stand-alone module of LB and MB power amplifiers or PAs that are integrated into one or more 4G/5G modules. Since the 2G PAs cover existing frequency bands which can overlap with a significant portion of the desired EN-DC frequency bands and the 2G PAs currently have load lines adequate to support the power levels specified for 4G/5G EN-DC operation, these PAs can be used for dual applications. These dual applications can be supported by adding post PA switching to route the amplifier signals to either the 2G or 4G/5G EN-DC signal paths.

In certain instances, input switching to select either a 2G signal or a 4G/5G EN-DC signal from a transmitter can be implemented. Broad-banding of the existing 2G PAs may be desired to allow coverage of a wider frequency range of dual connectivity band combinations. In some instances, a load line switch for the 2G PAs can be included in order to achieve higher efficiency for dual connectivity applications at lower power levels given that the 2G PAs typically operate directly from the battery and may not be able to improve the PA efficiency by dropping the PA collector voltage. Integrated couplers can be included to support power measurements during dual connectivity operation.

Examples of dual connectivity modes include (1) concurrent LTE Band 20 and NR Band n1 transmissions and (2) concurrent Band 3 and Band n1 transmissions. Concurrent transmissions of any suitable combination of an LTE band transmission and an NR band transmission can be implemented. Any other suitable combination of concurrent transmissions associated with two different radio access technologies can be implemented in accordance with any suitable principles and advantages disclosed herein.

By using the LB and MB 2G Power Amplifiers for dual connectivity operation, the placement and cost of two additional PAs can be eliminated in a power amplifier system. By saving the additional expense and board space for one or more additional power amplifiers, EN-DC solutions disclosed herein provide advantages to traditional solutions.

Embodiments disclosed herein can eliminate the need to place one or more additional PAs to support a 4G EN-DC Band. 5G NSA operation can be supported using an existing 2G PA during a time when the 2G PA would previously have been idle. This can extend the use of the 2G PA and facilitate the transition to 5G at a lower cost.

Although certain embodiments disclosed herein are related to dual connectivity operation, any suitable principles and advantages disclosed herein can be implemented in other applications where a plurality of radio frequency signals are being concurrently generated for transmission. For instance, any suitable combination of features described with reference to dual connectivity can be implemented in association with carrier aggregation. The carrier aggregation can be an uplink carrier aggregation. As another example, any suitable combination of features described with reference to dual connectivity can be implemented in association with multiple-input multiple-output (MIMO) communications. The MIMO communication can be an uplink MIMO communication. In these examples, an existing 2G PA can be used to generate an individual carrier of a carrier aggregation or for a signal for an individual data stream of a MIMO communication.

Communication Network

Figure 2:
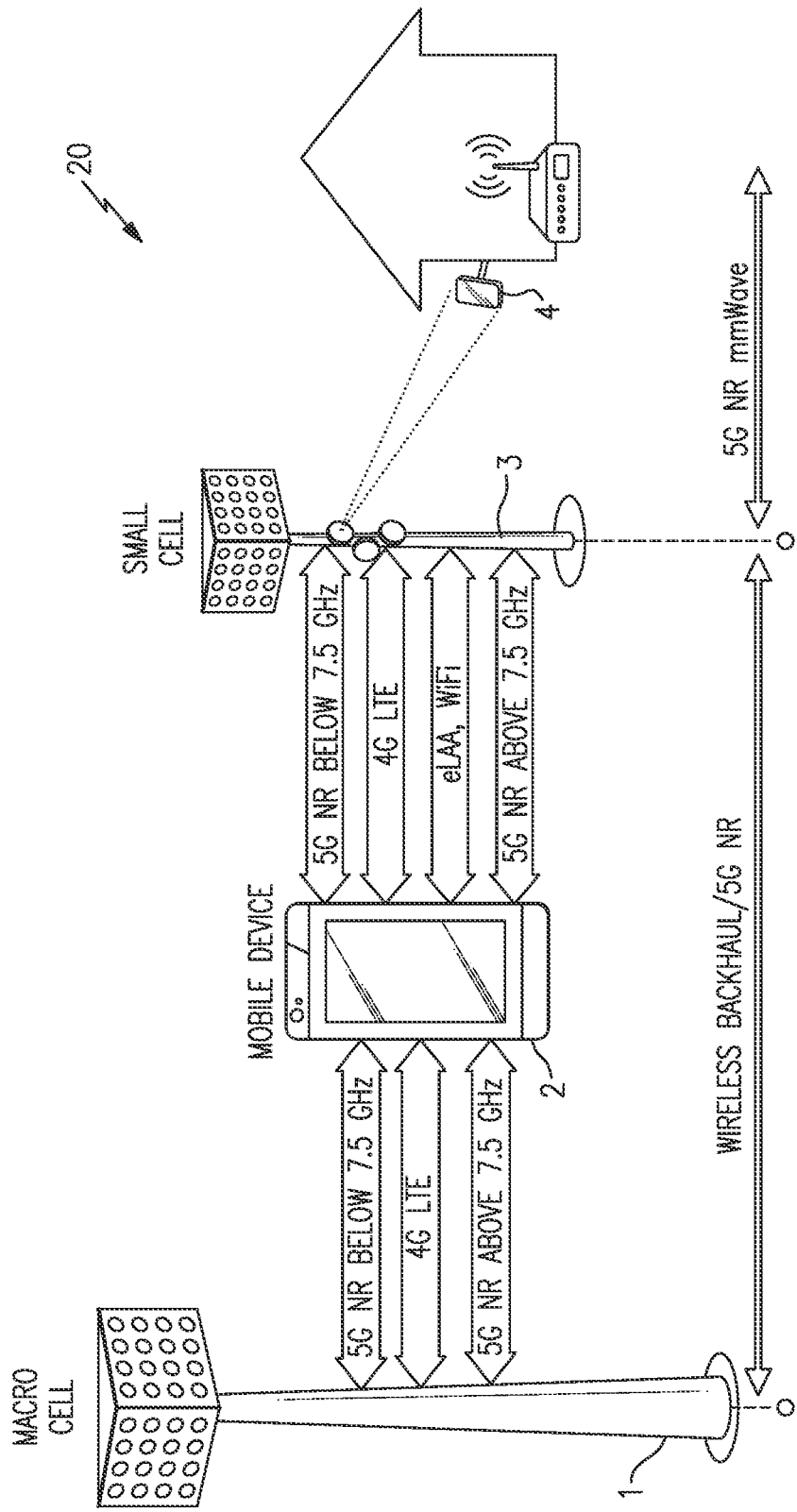
FIG. 2 is a schematic diagram of one example of a communication network.

FIG. 2 is a schematic diagram of one example of a communication network 20. The communication network 20 includes a macro cell base station 1, a mobile device 2, a small cell base station 3, and a stationary wireless device 4.

The illustrated communication network 20 of FIG. 2 supports communications using a variety of technologies, including, for example, 4G LTE, 5G NR, and wireless local area network (WLAN), such as Wi-Fi. In the communication network 20, dual connectivity can be implemented with concurrent 4G LTE and 5G NR communication with the mobile device 2. Although various examples of supported communication technologies are shown, the communication network 20 can be adapted to support a wide variety of communication technologies.

Various communication links of the communication network 20 have been depicted in FIG. 2. The communication links can be duplexed in a wide variety of ways, including, for example, using frequency-division duplexing (FDD) and/or time-division duplexing (TDD). FDD is a type of radio frequency communications that uses different frequencies for transmitting and receiving signals. FDD can provide a number of advantages, such as high data rates and low latency. In contrast, TDD is a type of radio frequency communications that uses about the same frequency for transmitting and receiving signals, and in which transmit and receive communications are switched in time. TDD can provide a number of advantages, such as efficient use of spectrum and variable allocation of throughput between transmit and receive directions.

As shown in FIG. 2, the mobile device 2 communicates with the macro cell base station 1 over a communication link that uses a combination of 4G LTE and 5G NR technologies. The mobile device 2 also communications with the small cell base station 3. In the illustrated example, the mobile device 2 and small cell base station 3 communicate over a communication link that uses 5G NR, 4G LTE, and Wi-Fi technologies. In certain implementations, enhanced license assisted access (eLAA) is used to aggregate one or more licensed frequency carriers (for instance, licensed 4G LTE and/or 5G NR frequencies), with one or more unlicensed carriers (for instance, unlicensed Wi-Fi frequencies).

In certain implementations, the mobile device 2 communicates with the macro cell base station 2 and the small cell base station 3 using 5G NR technology over one or more frequency bands that are less than 7.5 Gigahertz (GHz) and/or over one or more frequency bands that are greater than 7.5 GHz. For example, wireless communications can utilize Frequency Range 1 (FR1), Frequency Range 2 (FR2), or a combination thereof. In one embodiment, the mobile device 2 supports a HPUE power class specification.

The illustrated small cell base station 3 also communicates with a stationary wireless device 4. The small cell base station 3 can be used, for example, to provide broadband service using 5G NR technology. In certain implementations, the small cell base station 3 communicates with the stationary wireless device 4 over one or more millimeter wave frequency bands in the frequency range of 30 GHz to 300 GHz and/or upper centimeter wave frequency bands in the frequency range of 24 GHz to 30 GHz.

In certain implementations, the small cell base station 3 communicates with the stationary wireless device 4 using beamforming. For example, beamforming can be used to focus signal strength to overcome path losses, such as high loss associated with communicating over millimeter wave frequencies.

The communication network 20 of FIG. 2 includes the macro cell base station 1 and the small cell base station 3. In certain implementations, the small cell base station 3 can operate with relatively lower power, shorter range, and/or with fewer concurrent users relative to the macro cell base station 1. The small cell base station 3 can also be referred to as a femtocell, a picocell, or a microcell.

Although the communication network 20 is illustrated as including two base stations, the communication network 20 can be implemented to include more or fewer base stations and/or base stations of other types. As shown in FIG. 2, base stations can communicate with one another using wireless communications to provide a wireless backhaul. Additionally or alternatively, base stations can communicate with one another using wired and/or optical links.

The communication network 20 of FIG. 2 is illustrated as including one mobile device and one stationary wireless device. The mobile device 2 and the stationary wireless device 4 illustrate two examples of user devices or user equipment (UE). Although the communication network 20 is illustrated as including two user devices, the communication network 20 can be used to communicate with more or fewer user devices and/or user devices of other types. For example, user devices can include mobile phones, tablets, laptops, Internet of Things (IoT) devices, wearable electronics, and/or a wide variety of other communications devices.

User devices of the communication network 20 can share available network resources (for instance, available frequency spectrum) in a wide variety of ways.

In one example, frequency division multiple access (FDMA) is used to divide a frequency band into multiple frequency carriers. Additionally, one or more carriers are allocated to a particular user. Examples of FDMA include, but are not limited to, single carrier FDMA (SC-FDMA) and orthogonal FDMA (OFDMA). OFDMA is a multicarrier technology that subdivides the available bandwidth into multiple mutually orthogonal narrowband subcarriers, which can be separately assigned to different users.

Other examples of shared access include, but are not limited to, time division multiple access (TDMA) in which a user is allocated particular time slots for using a frequency resource, code division multiple access (CDMA) in which a frequency resource is shared amongst different users by assigning each user device a unique code, space-divisional multiple access (SDMA) in which beamforming is used to provide shared access by spatial division, and non-orthogonal multiple access (NOMA) in which the power domain is used for multiple access. For example, NOMA can be used to serve multiple user devices at the same frequency, time, and/or code, but with different power levels.

Enhanced mobile broadband (eMBB) refers to technology for growing system capacity of LTE networks. For example, eMBB can refer to communications with a peak data rate of at least 10 Gbps and a minimum of 100 Mbps for each user device. Ultra-reliable low latency communications (uRLLC) refers to technology for communication with very low latency, for instance, less than 2 milliseconds. uRLLC can be used for mission-critical communications such as for autonomous driving and/or remote surgery applications. Massive machine-type communications (mMTC) refers to low cost and low data rate communications associated with wireless connections to everyday objects, such as those associated with IoT applications.

The communication network 20 of FIG. 2 can be used to support a wide variety of advanced communication features, including, but not limited to eMBB, uRLLC, and/or mMTC.

A peak data rate of a communication link (for instance, between a base station and a user device) depends on a variety of factors. For example, peak data rate can be affected by channel bandwidth, modulation order, a number of component carriers, and/or a number of antennas used for communications.

For instance, in certain implementations, a data rate of a communication link can be about equal to $M*B*\log_2(1+S/N)$, where M is the number of communication channels, B is the channel bandwidth, and S/N is the signal-to-noise ratio (SNR).

Accordingly, data rate of a communication link can be increased by increasing the number of communication channels (for instance, transmitting and receiving using multiple antennas), using wider bandwidth (for instance, by aggregating carriers), and/or improving SNR (for instance, by increasing transmit power and/or improving receiver sensitivity).

5G NR communication systems can employ a wide variety of techniques for enhancing data rate and/or communication performance.

Power Amplifier Systems and Modules

Dual connectivity and other modes of operation where two different power amplifiers are concurrently active can be implemented in a variety of power amplifier systems. Example power amplifier systems and power amplifier modules will be discussed with reference to FIGS. 3 to 12. Any suitable combination of features of these example systems and/or modules can be implemented together with each other.

Power amplifier systems can be used to generate signals of a wide range of frequencies. For example, certain power amplifier systems can operate using one or more low bands (for example, RF signal bands having a frequency content of 1 GHz or less, also referred to herein as LB), one or more mid bands (for example, RF signal bands having a frequency content between 1 GHz and 2.3 GHz, also referred to herein as MB), and one or more high bands (for example, RF signal bands having a frequency content between 2.3 GHz and 3 GHz such as a frequency content between 2.3 GHz and 2.7 GHz, also referred to herein as HB.

Second generation (2G) power amplifiers (PAs) exist in a number of power amplifier system implementations. A 2G power amplifier is arranged to amplify a 2G radio frequency (RF) signal. One or more 2G PAs can be implemented as a stand-alone module of one or more Low Band (LB) and/or one or more Mid Band (MB) PAs. Alternatively or additionally, one or more 2G PAs can be integrated into one or more 4G and/or 5G modules.

Since the 2G PAs can cover existing frequency bands which overlap a significant portion of the desired EN-DC frequency bands and 2G PAs can include load-lines adequate to support the power levels specified for 4G/5G EN-DC operation, such 2G PAs can be used in EN-DC applications. Accordingly, embodiments of this disclosure relate to using existing 2G PAs for both 2G applications and 4G/5G EN-DC applications.

Power amplifier systems can be arranged to support both 2G and EN-DC operations for one or more PAs. Post PA switching can route a PA output signal to a 2G signal path in a 2G mode and to a 4G/5G EN-DC signal path in an EN-DC mode. In some instances, input switching can selectively provide a 2G signal or a 4G/5G EN-DC signal from a transmitter to a PA. Broad-banding of the existing 2G PAs may be desired to allow for coverage of a wider frequency range of dual connectivity band combinations. Such broad-banding can involve increasing the bandwidth of a PA. In certain instances, a load line switch can be included for one or more 2G PAs in order to achieve higher efficiency for EN-DC applications at lower power levels. This can be significant given that 2G PAs can operate directly from a battery voltage without being able to increase PA efficiency by dropping the PA collector voltage. Any suitable combination of these features to support dual mode operation of a PA can be implemented in association with any suitable principles and advantages disclosed herein.

Using a power amplifier for two different modes of operation instead of using two separate power amplifiers can implement a power amplifier system with one less power amplifier. For example, by using the LB and MB 2G Power Amplifiers for EN-DC operation, two additional PAs can be eliminated from some previous EN-DC systems that implemented separate PAs for 2G mode and EN-DC mode.

Figure 3:
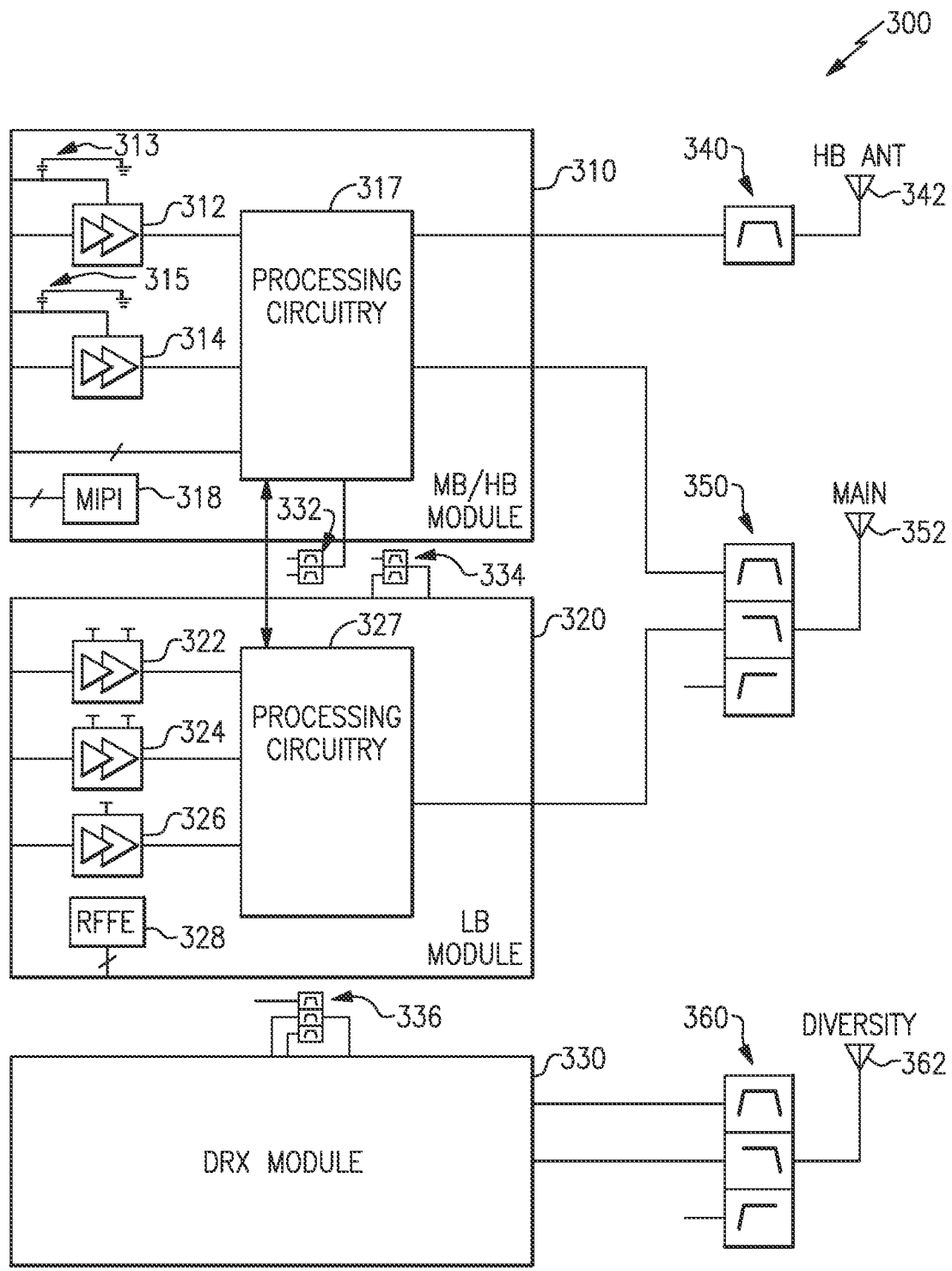
FIG. 3 is a schematic block diagram of a power amplifier system arranged for dual connectivity according to an embodiment.

FIG. 3 is a schematic block diagram of a power amplifier system 300 arranged for dual connectivity according to an embodiment. In the power amplifier system 300, 2G PAs are used for 4G/5G EN-DC applications. By contrast, 2G PAs have typically been inactive in an EN-DC mode in certain existing 4G/5G EN-DC applications.

As illustrated, the power amplifier system 300 includes a MB/HB module 310, a LB module 320, and a diversity receive (DRX) module 330. The power amplifier system 300 also includes multiplexers electrically connected to circuitry of these modules. The multiplexers include duplexers 332 and 334 and triplexer 336 arranged to filter radio frequency signals. One or more of the illustrated multiplexers can be implemented external to the illustrated modules. One or more of the illustrated multiplexers can be included as part of a module, such as one or more of the MB/HB module 310, the LB module 320, and the DRX module 330.

The illustrated LB module 320 includes a first 2G PA 322, a second 2G PA 324, a LB PA 326, RF front end processing circuitry 327, and RFFE (Radio Frequency Front End) control circuitry 328. The first 2G PA 322 and the second 2G PA 324 can each be arranged for amplifying a 2G signal and for amplifying an RF signal in a dual connectivity mode. The LB PA 326 can be arranged to amplify a LB 5G signal.

The first 2G PA 322 can be arranged to be active in a dual connectivity mode. The first 2G PA 322 can provide a 4G LTE LB signal during the dual connectivity mode while a 5G PA of the power amplifier system 300 is also active. Alternatively or additionally, the first 2G PA 322 can provide a 5G signal during the dual connectivity mode while a 4G PA of the power amplifier system 300 is also active in instances where the first 2G PA 322 is capable of supporting the bandwidth for the 5G signal. The first 2G PA 322 can amplify a LB 2G signal in a 2G mode. An output of the first 2G PA 322 can be electrically connected to different signal paths in the dual connectivity mode and the 2G mode.

The second 2G PA 324 can be arranged to be active in a dual connectivity mode. The second 2G PA 324 can provide a 4G LTE HB signal during the dual connectivity mode while a 5G PA of the power amplifier system 300 is also active. Alternatively or additionally, the second 2G PA 324 can provide a 5G signal during the dual connectivity mode while a 4G PA of the power amplifier system 300 is also active in instances where the second 2G PA 324 is capable of supporting the bandwidth for the 5G signal. The second 2G PA 324 can provide a 4G LTE MB signal during the dual connectivity mode while a 5G PA of the power amplifier system 300 is also active. The second 2G PA 324 can amplify a HB 2G signal in a 2G mode. An output of the second 2G PA 324 can be electrically connected to different signal paths in the dual connectivity mode and the 2G mode.

The RF front end processing circuitry 327 can include RF signal paths arranged to process RF signals. Such signal paths can include one or more switches, one or more filters and/or duplexers, one or more matching networks, one or more radio frequency couplers, the like, or any suitable combination thereof. The 2G PAs 322 and 324 can be electrically connected to different respective signal paths in different modes so that 2G signal and signals for dual connectivity can be processed differently. A signal path between the first 2G PA 322 and an antenna can include circuitry of the RF processing circuitry 327 and other processing circuitry external to the LB module 320. A signal path between the second 2G PA 324 and an antenna can include circuitry of the RF processing circuitry 327 and other processing circuitry external to the LB module 320.

The illustrated MB/HB module 310 includes a MB PA 312 and associated capacitor 313, a HB PA 314 and associated capacitor 315, RF front end processing circuitry 317, and a MIPI control circuit 318 arranged to provide control functionality. The MB PA 312 can amplify MB signals. The MB PA 312 can be arranged to amplify 5G NR signals. The HB PA 314 can amplify HB signals. The HB PA 314 can be arranged to amplify 5G NR signals. The RF front end processing circuitry 317 can include RF signal paths arranged to process RF signals. Such signal paths can include one or more switches, one or more filters and/or duplexers, one or more matching networks, one or more radio frequency couplers, the like, or any suitable combination thereof.

The diversity receive module 330 can perform signal processing on signals received by the diversity antenna 362. The diversity receive module 330 can include one or more low noise amplifiers, one or more filters and/or duplexers, one or more matching networks, one or more switches, one or more RF couplers, one or more power detectors, the like, or any suitable combination thereof.

The MB/HB module 310, the LB module 320, and the DRX module 330 are in communication with various antennas by way of various filters. For example, the MB/HB module 310 is in communication with a high band antenna 342 via filter 340. The MB/HB module 310 is in communication with a main antenna 352 via a first filter of the triplexer 350. The LB module is in communication with the main antenna via a second filter of the triplexer 350. The DRX module 330 is in communication with a diversity receive antenna 362 via filters of the triplexer 360.

Figure 4:
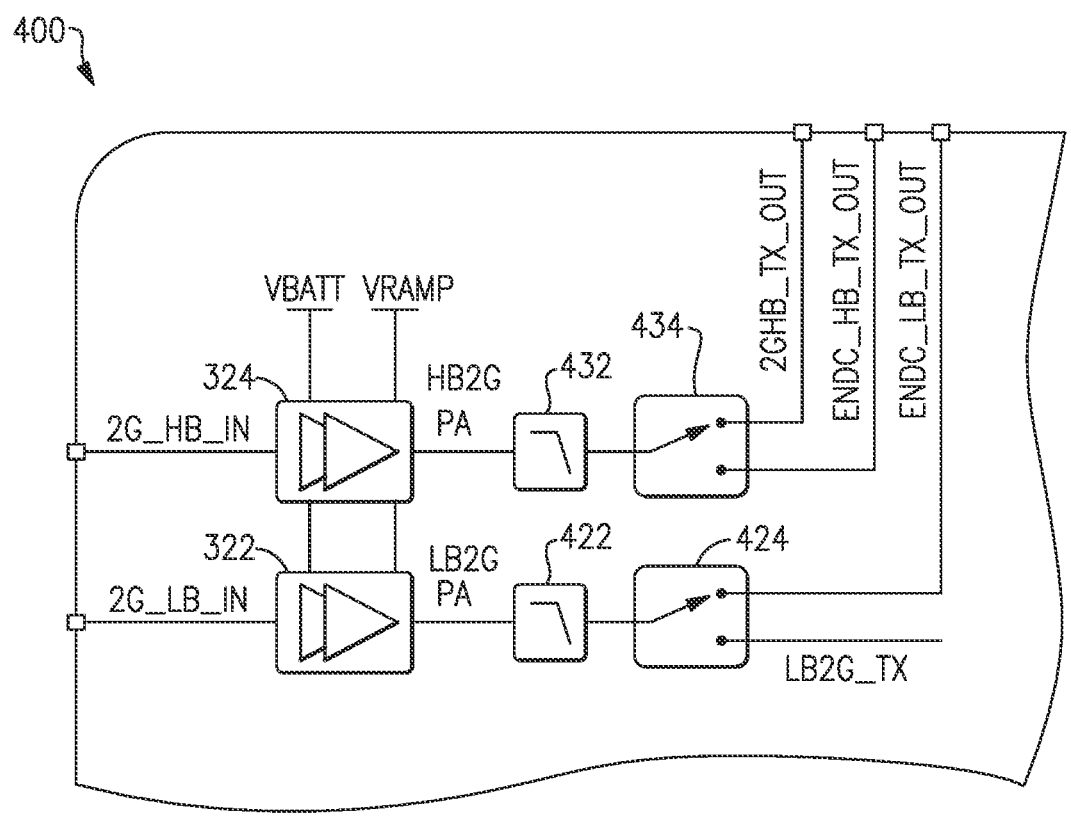
FIG. 4 is a schematic block diagram of part of a power amplifier module according to an embodiment.

FIG. 4 is a schematic block diagram of part of a power amplifier module 400 according to an embodiment. As illustrated, the power amplifier module 400 includes a first 2G PA 322, a second 2G PA 324, a first filter 422, a second filter 432, a first switch 424, and a second switch 434. The part of the power amplifier module 400 can be included in the LB module 320 of FIG. 3, for example. The first filter 422, the second filter 432, the first switch 424, and the second switch 434 can be included in the RF front end processing circuitry 327 of FIG. 3 in certain applications.

The switches 424 and 434 support signal routing for 2G operation and EN-DC operation. The switches 424 and 434 function as band select/mode select switches coupled to outputs of respective 2G PAs 322 and 324, respectively.

An output signal provided by the first 2G PA 322 can be filtered by the first filter 422 and provided to the first switch 424. The first filter 422 can be a low pass filter. The first switch 424 can electrically connect the output of the first 2G PA 322 to a 2G LB signal path in a 2G mode. The first switch 424 can electrically connect the output of the first 2G PA 322 to a LB EN-DC signal path in an EN-DC mode. Accordingly, the first switch 424 can route an output of the first 2G PA 322 for either 2G or 4G/5G EN-DC operation. The 2G PA 322 can provide a radio frequency output signal associated with a different radio access technology in the EN-DC mode than in the 2G mode.

An output signal provided by the second 2G PA 324 can be filtered by the second filter 432 and provided to the second switch 434. The second switch 434 can electrically connect the output of the second 2G PA 324 to a 2G signal path in a 2G mode. The second switch 434 can electrically connect the output of the second 2G PA 324 to a HB EN-DC signal path in an EN-DC mode. Accordingly, the second switch 434 can route an output of the second 2G PA 324 for either 2G or 4G/5G EN-DC operation. The 2G PA 324 can provide a radio frequency output signal associated with a different radio access technology in the EN-DC mode than in the 2G mode.

In some embodiments (not illustrated), a supply voltage for the first 2G PA 322 and/or second 2G PA 324 can be adjusted to be different for 2G mode and EN-DC mode.

A load line coupled to the output of the first 2G PA 322 and/or a load line coupled to an output second 2G PA 324 can be adjusted to provide different impedances for 2G mode and EN-DC mode. This can reduce power for EN-DC mode relative to 2G mode. Adjusting impedance of a load line can improve efficiency for the 2G mode and/or the EN-DC mode.

Figure 5:
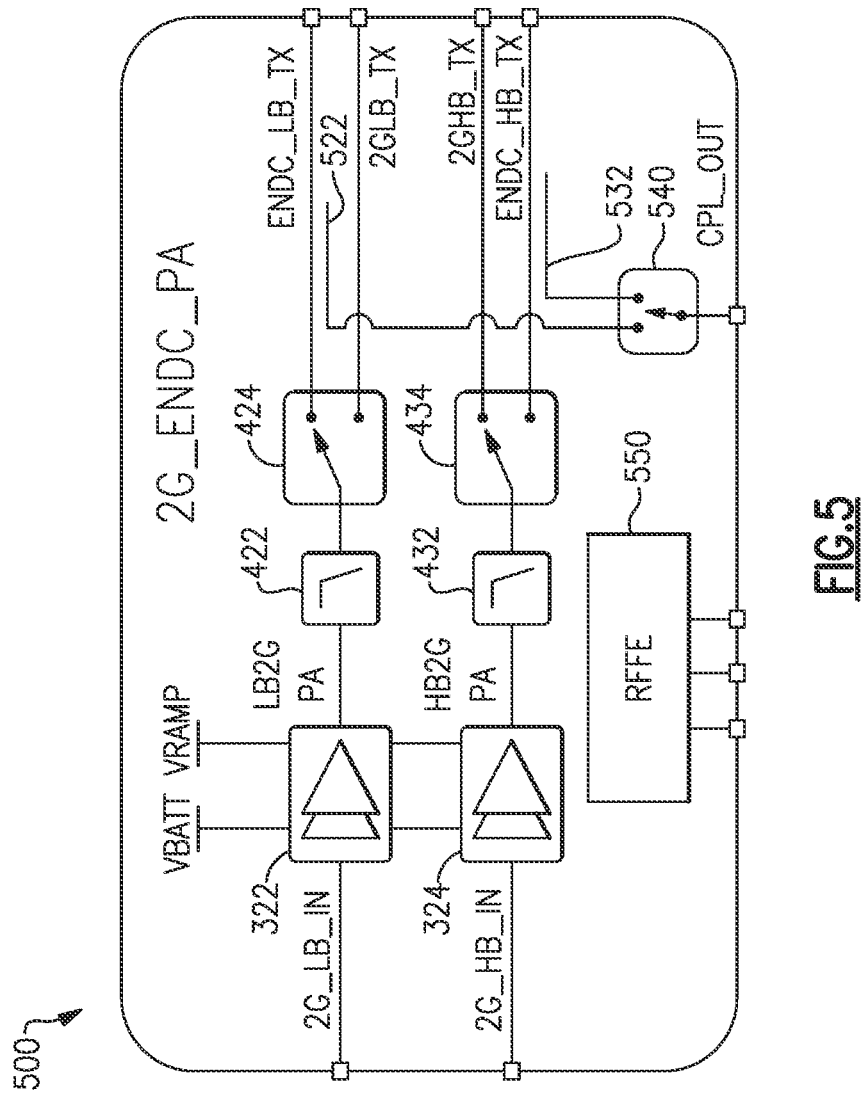
FIG. 5 is a schematic block diagram of part of a power amplifier module according to an embodiment.

FIG. 5 is a schematic block diagram of part of a power amplifier module 500 according to an embodiment. The power amplifier module 500 is a standalone 2G EN-DC power amplifier module. Like in the power amplifier module 400, the first switch 424 and the second switch 434 can route outputs of respective 2G PAs 322 and 324 for 2G operation and for 4G/5G EN-DC operation in the power amplifier module 500.

The power amplifier module 500 also includes radio frequency couplers 522 and 532. The radio frequency couplers 522 and 532 can provide RF samples of EN-DC signals output from the power amplifier module 500. The RF samples can be provided to an output of the power amplifier module 500 via a switch 540. Integrated radio frequency couplers 522 and 532 can advantageously provide an indication of output power for EN-DC signals provided by the power amplifier module 500 at an output of the power amplifier module 500. This can support power measurements during EN-DC operation. The power amplifier module 500 also includes a RFFE control circuit 550 that provides control functionality.

Figure 6:
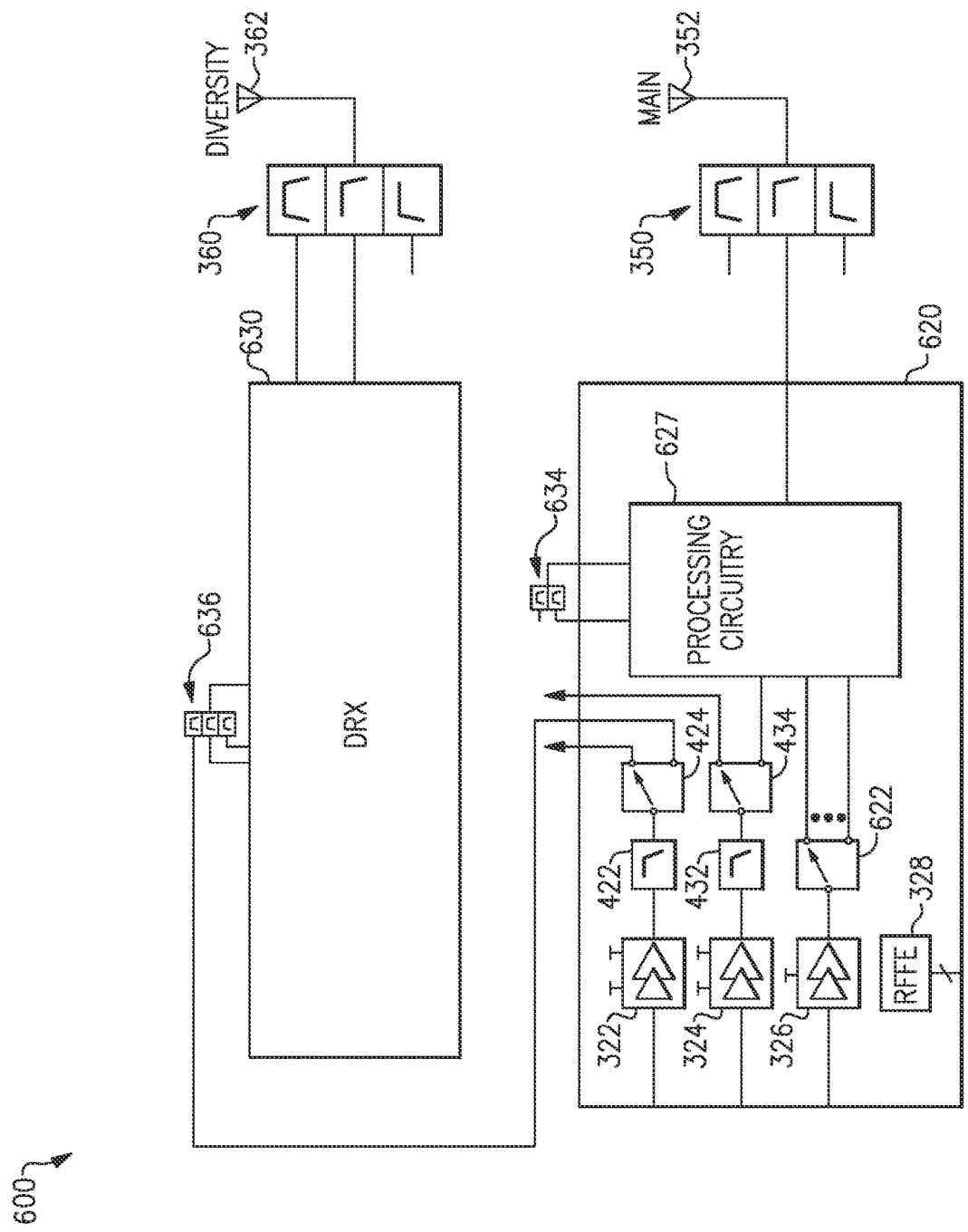
FIG. 6 is a schematic block diagram of a power amplifier system arranged for dual connectivity according to an embodiment.

FIG. 6 is a schematic block diagram of a power amplifier system 600 arranged for dual connectivity according to an embodiment. A 2G PA is used for a 4G/5G EN-DC application in the power amplifier system 600. As illustrated, the power amplifier system 600 includes a LB module 620 and a DRX module 630. The power amplifier system 600 also includes multiplexers electrically connected to circuitry of these modules. The multiplexers include a duplexer 634 and a triplexer 636. One or more of the illustrated multiplexers can be implemented external to the illustrated modules. One or more of the illustrated multiplexers can be included as part of a module, such as the LB module 620 and/or the DRX module 630. One or more of the illustrated multiplexers can include a filter that is included as part of a module and another filter that is external to the module.

As an example, the power amplifier system 600 can support a LB EN-DC mode for 4G LTE Band 20 and 5G NR Band n28. In this example, the first 2G PA 322 can provide a 4G Band 20 signal while the LB PA 326 provides a 5G Band n28 signal. The duplexer 634 can be a Band n28 duplexer and the triplexer can include a Band 20 transmit filter. The first 2G PA 322 can provide an amplified RF signal to the Band 20 transmit filter of the triplexer 636 via the first switch 424 in the EN-DC mode. The LB PA 326 can concurrently provide another amplified RF signal to a transmit filter of duplexer 624 via a switch 622 and circuitry of the RF frequency processing circuitry 627.

Figure 7:
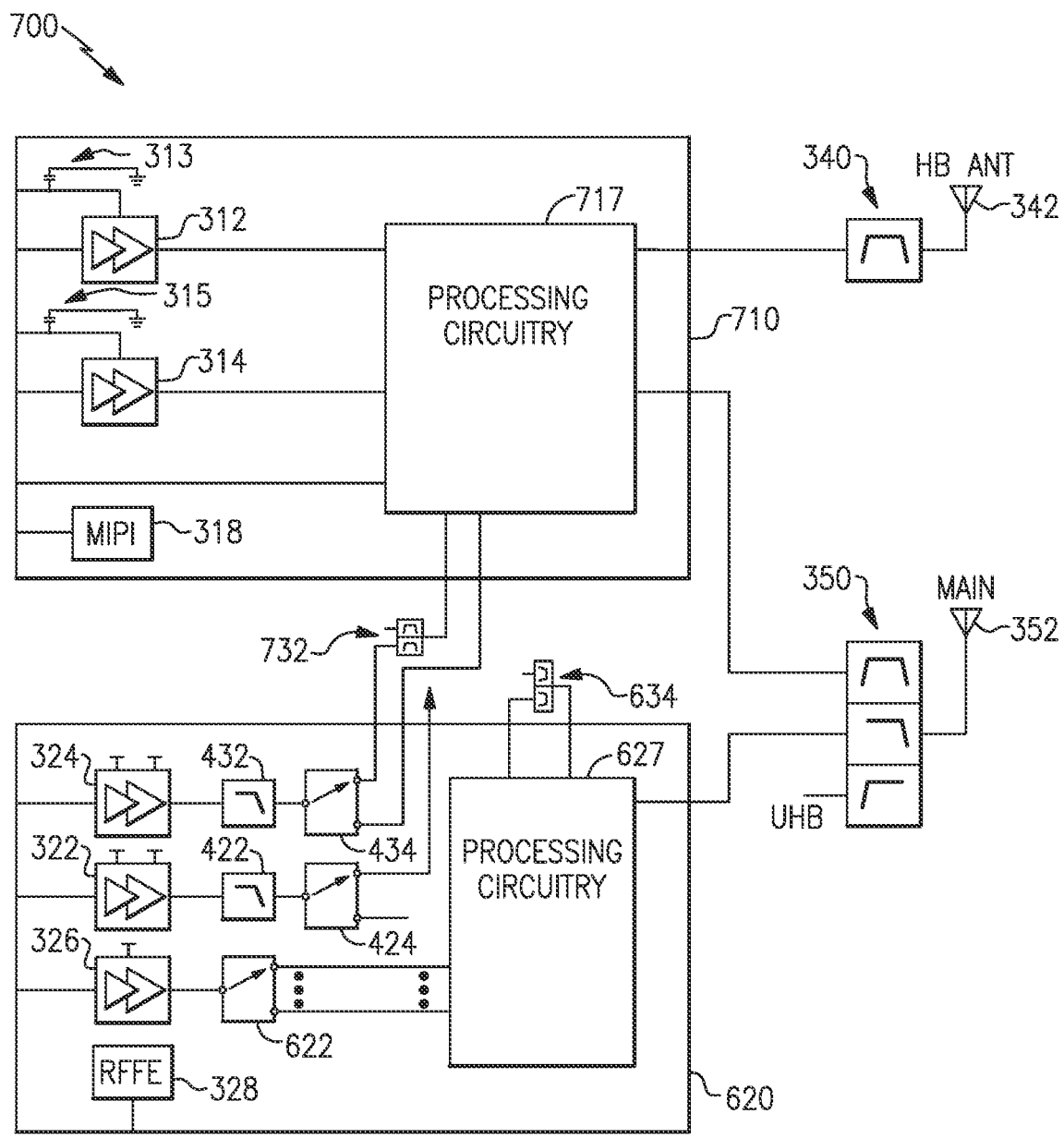
FIG. 7 is a schematic block diagram of a power amplifier system arranged for dual connectivity according to an embodiment.

FIG. 7 is a schematic block diagram of a power amplifier system 700 arranged for dual connectivity according to an embodiment. A 2G PA is used for a 4G/5G EN-DC application in the power amplifier system 700. As illustrated, the power amplifier system 700 includes a MB/HB module 710 and a LB module 620. The power amplifier system 700 also includes multiplexers electrically connected to circuitry of these modules. The multiplexers include a duplexer 634 and a duplexer 732. One or more of the illustrated multiplexers can be implemented external to the illustrated modules. One or more of the illustrated multiplexers can be included as part of a module, such as the LB module 620 and/or the MB/HB module 710. One or more of the illustrated multiplexers can include a filter that is included as part of a module and another filter that is external to the module.

As an example, the power amplifier system 700 can support a MB EN-DC mode for 4G LTE Band 3 and 5G NR Band n1. In this example, the second 2G PA 324 can provide a 4G Band 3 signal while the MB PA 312 provides a 5G Band n1 signal. The duplexer 732 can be a Band 3 duplexer. The second 2G PA 324 can provide an amplified RF signal to the Band 3 transmit filter of the duplexer 732 via the second switch 434 in the EN-DC mode. The MB PA 312 can concurrently provide another amplified RF signal to a Band n1 transmit filter of the RF frequency processing circuitry 717.

In an embodiment, a power amplifier system can include the LB module 620 of FIGS. 6 and 7, the DRX module 630 of FIG. 6, and the HB/MB module 710 of FIG. 7. Such an embodiment can implement the dual connectivity features described with reference to FIGS. 6 and 7.

Example EN-DC cases are discussed with reference to FIGS. 6 and 7. Any suitable dual connectivity case can be implemented in accordance with any suitable principles and advantages disclosed herein. In some instances, one or more 2G PAs can be arranged to have broader bandwidth to support any suitable dual connectivity cases.

Figure 8:
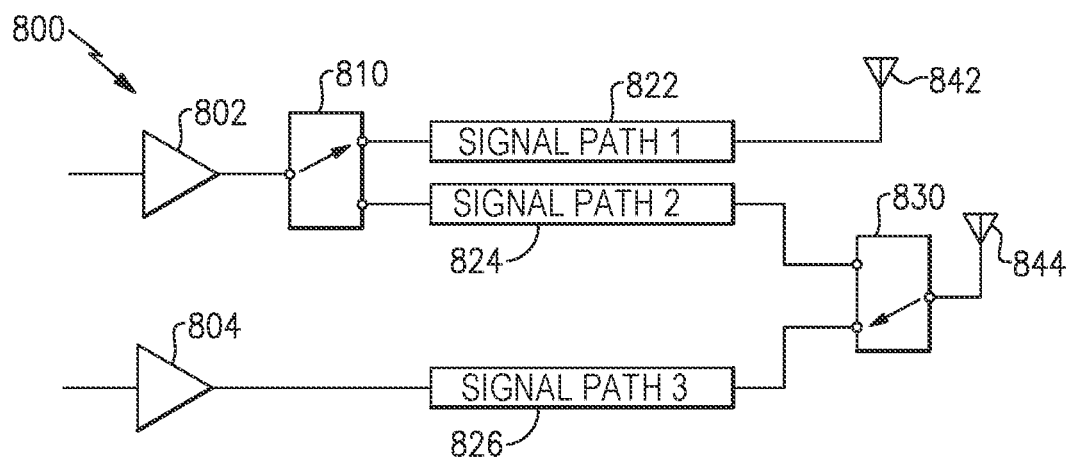
FIG. 8 is a schematic block diagram of a power amplifier system according to an embodiment.

FIG. 8 is a schematic block diagram of a power amplifier system 800 according to an embodiment. As illustrated, the power amplifier system 800 includes a first PA 802, a second PA 804, a first switch 810, a first signal path 822, a second signal path 824, a third signal path 826, a second switch 830, a first antenna 842, and a second antenna 844.

The first power amplifier 802 is arranged to be active in a first mode and to be active in a second mode. The second power amplifier 804 is arranged to be active in the first mode such that the first power amplifier 802 and the second power amplifier 804 are concurrently active in the first mode. The second power amplifier 804 can be inactive in the second mode.

The first mode can be a dual connectivity mode, a carrier aggregation mode, a MIMO mode, or another mode where both the first power amplifier 802 and the second power amplifier 804 are active. As an example, the first mode can be a dual connectivity mode. The second mode can be a 2G mode, for example.

In the first mode, the first power amplifier 802 and the second power amplifier 804 can generate radio frequency signals in a common band range (e.g., LB, MB, or HB) or within different band ranges (e.g., first power amplifier 802 in different one of LB, MB, or HB than second power amplifier 804). The first power amplifier 802 and the second power amplifier 804 can generate radio frequency signals in any band range combination of Table 1 in the first mode.

TABLE 1

| First PA | LB | MB | HB | HB | MB | HB | LB | MB | LB |
|---|---|---|---|---|---|---|---|---|---|
| Second PA | LB | MB | HB | MB | HB | LB | HB | LB | MB |

The first power amplifier 802 has an output configured to provide a radio frequency signal associated with a different radio access technology in the first mode than in the second mode. For example, the first power amplifier 802 can provide a 4G signal in the first mode and a 2G signal in the second mode. As another example, the first power amplifier 802 can provide a 5G signal in the first mode and a 2G signal in the second mode. Accordingly, the first power amplifier 802 can provide radio frequency signals associated with different radio access technologies in different modes.

In certain instances, the first power amplifier 802 is arranged to have a broader bandwidth to operate in the first mode and the second mode than a similar power amplifier arranged to operate in only one of these modes.

The first switch 810 is arranged to electrically connect the output of the first power amplifier 802 to the first radio frequency signal path 822 in the first mode and to electrically connect the output of the first power amplifier 802 to the second radio frequency signal path 824 in the second mode. The first and second radio frequency signal paths 822 and 824 can process an output signal provided by the first power amplifier 802 differently to meet the specifications for the first mode and the second mode, respectively.

The first radio frequency signal path 822 can be arranged to process an output signal provided by the first power amplifier 802 in the first mode. The first radio frequency signal path 822 can include one or more filters (e.g., one or more filters having a passband associated with the first mode), one or more matching networks, one or more switches, one or more radio frequency couplers, the like, or any suitable combination thereof. The first radio frequency signal path 822 can include radio frequency processing circuitry of a power amplifier module of any of FIGS. 3-7 and/or circuitry external to a mode amplifier module.

The second radio frequency signal path 824 can be arranged to process an output signal provided by the first power amplifier 802 in the second mode. The second radio frequency signal path 824 can include one or more filters (e.g., one or more filters having a passband associated with the second mode), one or more matching networks, one or more switches, one or more radio frequency couplers, the like, or any suitable combination thereof. The second radio frequency signal path 824 can include radio frequency processing circuitry of a power amplifier module of any of FIGS. 3-7 and/or circuitry external to a mode amplifier module.

In some applications, a power supply voltage for the first power amplifier 802 can be adjusted for toggling between the first mode and the second mode. The first power amplifier 802 can operate with a lower power in the first mode than in the second mode. The first power amplifier 802 can output a radio frequency signal associated with a different radio access technology in the second mode than in the first mode. The different radio access technologies can both be cellular radio access technologies.

In certain applications, the second power amplifier 804 can provide an output signal associated with a different radio access technology than the first power amplifier 802 in the first mode. For example, in the first mode, the second power amplifier 804 can provide a 5G signal and the first power amplifier 802 can provide a 4G signal. As another example, in the first mode, the second power amplifier 804 can provide a 4G signal and the first power amplifier 802 can provide a 5G signal. The different radio access technologies can both be cellular radio access technologies.

In some other applications, the first power amplifier 802 and the second power amplifier 804 can provide output signals associated with the same radio access technology in the first mode. For example, in the first mode, the second power amplifier 804 and the first power amplifier 802 can both provide 4G signals in the first mode. As another example, in the first mode, the second power amplifier 804 and the first power amplifier 802 can both provide 5G signals in the first mode. In these examples, the first power amplifier 802 and the second power amplifier 804 can provide signals for carrier aggregation and/or MIMO communications in the first mode.

The third radio frequency signal path 826 can be arranged to process an output signal provided by the second power amplifier 804 in the first mode. The third radio frequency signal path 826 can include one or more filters, one or more matching networks, one or more switches, one or more radio frequency couplers, the like, or any suitable combination thereof.

The second switch 830 can electrically connect the third signal path 826 to the second antenna 844 in the first mode and electrically connect the second signal path 824 to the second antenna 844 in the second mode. In the first mode, the output signal from the first power amplifier 802 can be transmitted from the first antenna 842 and the output signal from the second power amplifier 804 can be transmitted from the second antenna 844. In the second mode, the output signal from the first power amplifier 802 can be transmitted from the second antenna 844. The second antenna 844 can be a main antenna of a mobile device in certain applications.

Figure 9:
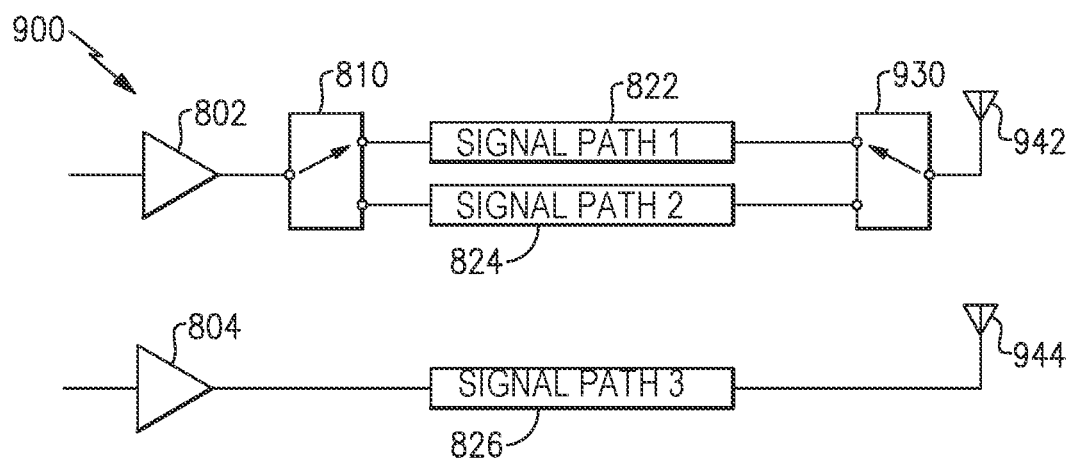
FIG. 9 is a schematic block diagram of a power amplifier system according to an embodiment.

FIG. 9 is a schematic block diagram of a power amplifier system 900 according to an embodiment. As illustrated, the power amplifier system 900 includes a first PA 802, a second PA 804, a first switch 810, a first signal path 822, a second signal path 824, a third signal path 826, a second switch 930, a first antenna 942, and a second antenna 944. In the power amplifier system 900, signals from the first power amplifier 802 are transmitted from a different antenna than signals from the second power amplifier 804. The second switch 930 is arranged to electrically connect the first signal path 822 to the first antenna 942 in the first mode and to electrically connect the second signal path 824 to the second antenna 944 in the second mode. Thus, the output signal from the first power amplifier 802 can be transmitted from the first antenna 942 in both the first mode and the second mode. Together the switches 810 and 930 couple the first power amplifier 802 to the first antenna 942 via different signal paths in different modes.

Figure 10:
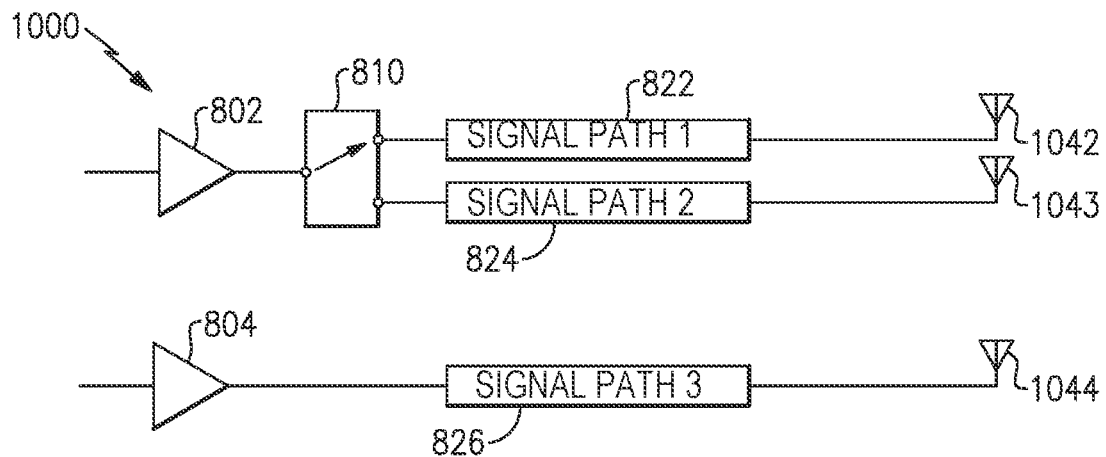
FIG. 10 is a schematic block diagram of a power amplifier system according to an embodiment.

FIG. 10 is a schematic block diagram of a power amplifier system 1000 according to an embodiment. As illustrated, the power amplifier system includes a first PA 802, a second PA 804, a first switch 810, a first signal path 822, a second signal path 824, a third signal path 826, a first antenna 1042, a second antenna 1043, and a third antenna 1044. In the power amplifier system 1000, an output signal from the first power amplifier 802 is transmitted from different antennas in different modes and also from a different antenna that an output signal from the second power amplifier 804. In the first mode, the output signal from the first power amplifier 802 can be transmitted from the first antenna 1042 while the output signal from the second power amplifier 804 is transmitted from the third antenna 1044. In the second mode, the output from the first power amplifier 802 can be transmitted from the second antenna 1043.

In some other applications, the first power amplifier 802 and the second power amplifier 804 can both provide a respective radio frequency signal to the same antenna in a mode in which both the first power amplifier 802 and the second power amplifier 804 are concurrently active. In such applications, the first power amplifier 802 and the second power amplifier 804 can generate radio frequency signals with different frequency contents that are frequency domain multiplexed and then provided to the same antenna. For example, the power amplifiers 802 and 804 can generate radio frequency signals with different frequency contents for a carrier aggregation and the radio frequency signals can be combined by a multiplexer for transmission from the same antenna.

In certain applications, input switching can select which transmitter to electrically connect to an input of a power amplifier for different modes. For example, an input switch for a 2G PA can provide a 2G signal to the input of the 2G PA in a 2G mode and provide a 4G/5G EN-DC signal to the input of the 2G PA in an EN-DC mode.

Figure 11:
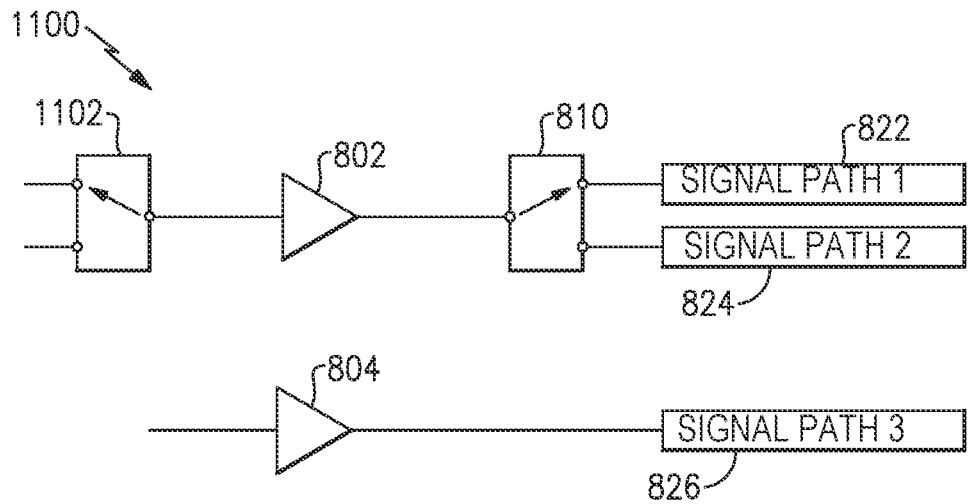
FIG. 11 is a schematic block diagram of a power amplifier system with an input switch according to an embodiment.

FIG. 11 is a schematic block diagram of a power amplifier system 1100 with an input switch 1102 according to an embodiment. The input switch 1102 can electrically connect different transmitters to an input of the power amplifier 802 in different modes. The input switch 1102 can be implemented together with any suitable principles and advantages disclosed herein. For example, the input switch 1102 can be added to any other embodiments of power amplifier systems and/or modules disclosed herein. The input switch 1102 can be included in a packaged module that also includes any suitable combination of features of the power amplifier module 400 of FIG. 4. The input switch 1102 can be included in a packaged module that also includes any suitable combination of features of the power amplifier module 500 of FIG. 5.

In certain applications, a load line on an output of a power amplifier operable in a plurality of modes can be adjustable for the different modes. For example, an adjustable load line on an output of a 2G PA can provide improved efficiency at a desired operating power level by adjusting when toggling between 2G mode and EN-DC mode. Load line switching can adjust the load line and improve the operating efficiency if the target output power levels for 2G and EN-DC are significantly different.

Figure 12:
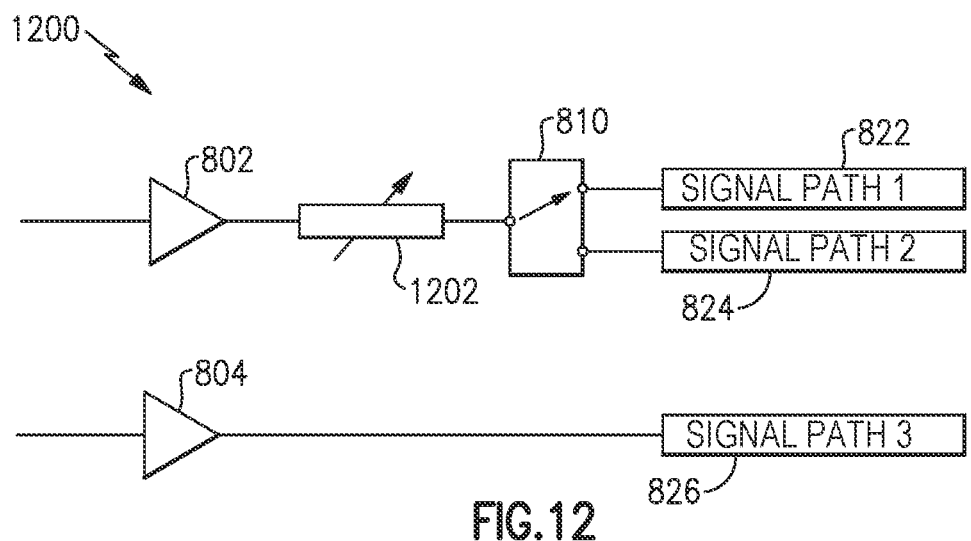
FIG. 12 is a schematic block diagram of a power amplifier system with an adjustable load line according to an embodiment.

FIG. 12 is a schematic block diagram of a power amplifier system 1200 with an adjustable load line 1202 according to an embodiment. The adjustable load line 1202 can adjust impedance of the load line for operating in different modes. For example, the adjustable load line 1202 can provide a different impedance for a 2G mode than for an EN-DC mode in order to improve and/or optimize efficiency at target operating power levels for each mode. The adjustable load line 1202 can implement load line switching to adjust impedance.

The adjustable load line 1202 can be implemented together with any suitable principles and advantages disclosed herein. For example, the adjustable load line 1202 can be added to any other embodiments of power amplifier systems and/or modules disclosed herein. The adjustable load line 1202 can be included in a packaged module that also includes any suitable combination of features of the power amplifier module 400 of FIG. 4. The adjustable load line 1202 can be included in a packaged module that also includes any suitable combination of features of the power amplifier module 500 of FIG. 5. The adjustable load line 1202 can be included in a packaged module that also includes the input switch 1102 of FIG. 11 and any suitable combination of features of the power amplifier module 400 of FIG. 4. The adjustable load line 1202 can be included in a packaged module that also includes the input switch 1102 of FIG. 11 and any suitable combination of features of the power amplifier module 500 of FIG. 5.

Carrier Aggregation

Figure 13A:
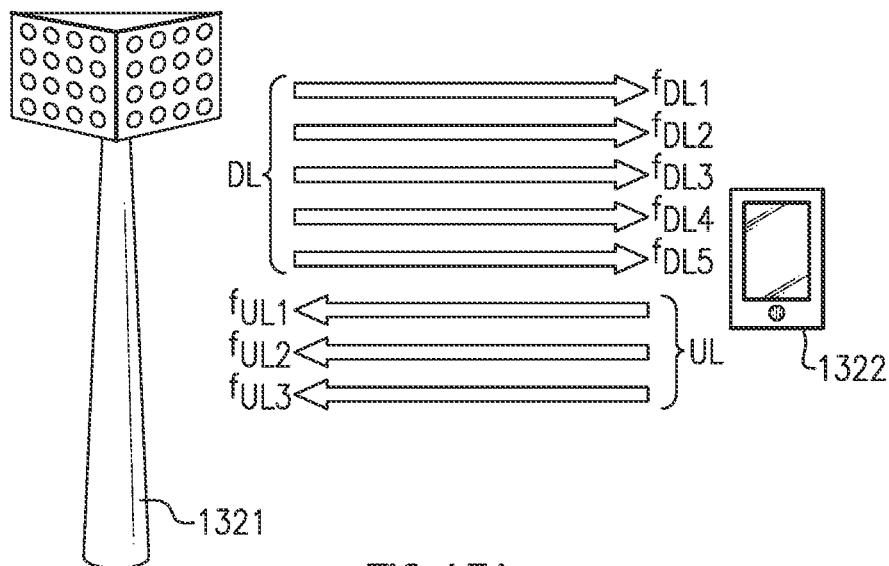
FIG. 13A is a schematic diagram of one example of a communication link using carrier aggregation.

FIG. 13A is a schematic diagram of one example of a communication link using carrier aggregation. Carrier aggregation can be used to widen bandwidth of the communication link by supporting communications over multiple frequency carriers, thereby increasing user data rates and enhancing network capacity by utilizing fragmented spectrum allocations. Power amplifiers disclosed herein can be implemented in carrier aggregation applications.

In the illustrated example, the communication link is provided between a base station 1321 and a mobile device 1322. As shown in FIG. 13A, the communications link includes a downlink channel used for RF communications from the base station 1321 to the mobile device 1322, and an uplink channel used for RF communications from the mobile device 1322 to the base station 1321.

Although FIG. 13A illustrates carrier aggregation in the context of FDD communications, carrier aggregation can also be used for TDD communications.

In certain implementations, a communication link can provide asymmetrical data rates for a downlink channel and an uplink channel. For example, a communication link can be used to support a relatively high downlink data rate to enable high speed streaming of multimedia content to a mobile device, while providing a relatively slower data rate for uploading data from the mobile device to the cloud.

In the illustrated example, the base station 1321 and the mobile device 1322 communicate via carrier aggregation, which can be used to selectively increase bandwidth of the communication link. Carrier aggregation includes contiguous aggregation, in which contiguous carriers within the same operating frequency band are aggregated. Carrier aggregation can also be non-contiguous, and can include carriers separated in frequency within a common band or in different bands.

In the example shown in FIG. 13A, the uplink channel includes three aggregated component carriers $F_{UL1}$, $f_{UL2}$, and $f_{UL3}$. Additionally, the downlink channel includes five aggregated component carriers $f_{DL1}$, $f_{DL2}$, $f_{DL3}$, $f_{DL4}$, and $f_{DL5}$. Although one example of component carrier aggregation is shown, more or fewer carriers can be aggregated for uplink and/or downlink. Moreover, a number of aggregated carriers can be varied over time to achieve desired uplink and downlink data rates.

For example, a number of aggregated carriers for uplink and/or downlink communications with respect to a particular mobile device can change over time. For example, the number of aggregated carriers can change as the device moves through the communication network and/or as network usage changes over time.

Figure 13B:
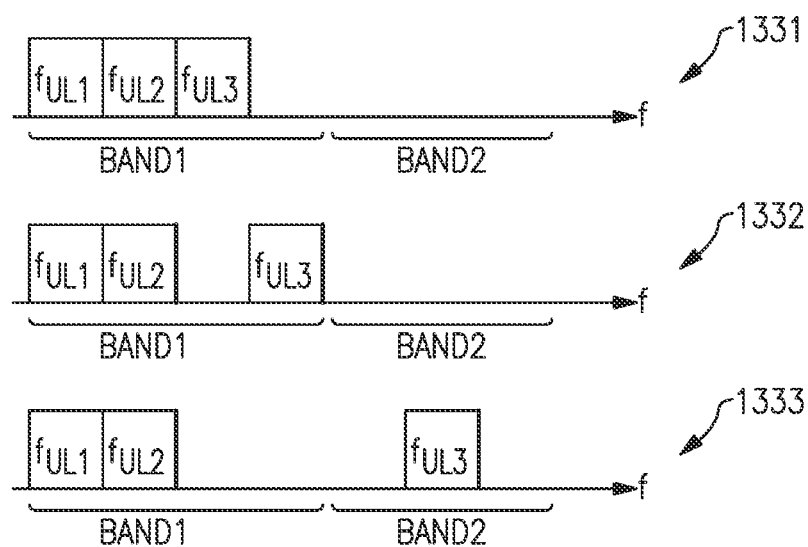
FIG. 13B illustrates various examples of uplink carrier aggregation for the communication link of FIG. 13A.

FIG. 13B illustrates various examples of uplink carrier aggregation for the communication link of FIG. 13A. FIG. 13B includes a first carrier aggregation scenario 1331, a second carrier aggregation scenario 1332, and a third carrier aggregation scenario 1333, which schematically depict three types of carrier aggregation.

The carrier aggregation scenarios 1331-33 illustrate different spectrum allocations for a first component carrier $f_{UL1}$, a second component carrier $f_{UL2}$, and a third component carrier $F_{UL3}$. Although FIG. 13B is illustrated in the context of aggregating three component carriers, carrier aggregation can be used to aggregate more or fewer carriers. Moreover, although illustrated in the context of uplink, the aggregation scenarios are also applicable to downlink.

The first carrier aggregation scenario 1331 illustrates intra-band contiguous carrier aggregation, in which component carriers that are adjacent in frequency and in a common frequency band are aggregated. For example, the first carrier aggregation scenario 1331 depicts aggregation of component carriers $f_{UL1}$, $f_{UL2}$, and $f_{UL3}$ that are contiguous and located within a first frequency band BAND1.

With continuing reference to FIG. 13B, the second carrier aggregation scenario 1332 illustrates intra-band non-continuous carrier aggregation, in which two or more components carriers that are non-adjacent in frequency and within a common frequency band are aggregated. For example, the second carrier aggregation scenario 1332 depicts aggregation of component carriers $f_{UL1}$, $f_{UL2}$, and $f_{UL3}$ that are non-contiguous, but located within a first frequency band BAND1.

The third carrier aggregation scenario 1333 illustrates inter-band non-contiguous carrier aggregation, in which component carriers that are non-adjacent in frequency and in multiple frequency bands are aggregated. For example, the third carrier aggregation scenario 1333 depicts aggregation of component carriers $f_{UL1}$ and $f_{UL2}$ of a first frequency band BAND1 with component carrier $f_{UL3}$ of a second frequency band BAND2.

With reference to FIGS. 13A-13B, the individual component carriers used in carrier aggregation can be of a variety of frequencies, including, for example, frequency carriers in the same band or in multiple bands. Additionally, carrier aggregation is applicable to implementations in which the individual component carriers are of about the same bandwidth as well as to implementations in which the individual component carriers have different bandwidths.

Certain communication networks allocate a particular user device with a primary component carrier (PCC) or anchor carrier for uplink and a PCC for downlink. Additionally, when the mobile device communicates using a single frequency carrier for uplink or downlink, the user device communicates using the PCC. To enhance bandwidth for uplink communications, the uplink PCC can be aggregated with one or more uplink secondary component carriers (SCCs). Additionally, to enhance bandwidth for downlink communications, the downlink PCC can be aggregated with one or more downlink SCCs.

In certain implementations, a communication network provides a network cell for each component carrier. Additionally, a primary cell can operate using a PCC, while a secondary cell can operate using a SCC. The primary and secondary cells may have different coverage areas, for instance, due to differences in frequencies of carriers and/or network environment.

License assisted access (LAA) refers to downlink carrier aggregation in which a licensed frequency carrier associated with a mobile operator is aggregated with a frequency carrier in unlicensed spectrum, such as Wi-Fi. LAA employs a downlink PCC in the licensed spectrum that carries control and signaling information associated with the communication link, while unlicensed spectrum is aggregated for wider downlink bandwidth when available. LAA can operate with dynamic adjustment of secondary carriers to avoid Wi-Fi users and/or to coexist with Wi-Fi users. Enhanced license assisted access (eLAA) refers to an evolution of LAA that aggregates licensed and unlicensed spectrum for both downlink and uplink.

MIMO Communications

Figure 14A:
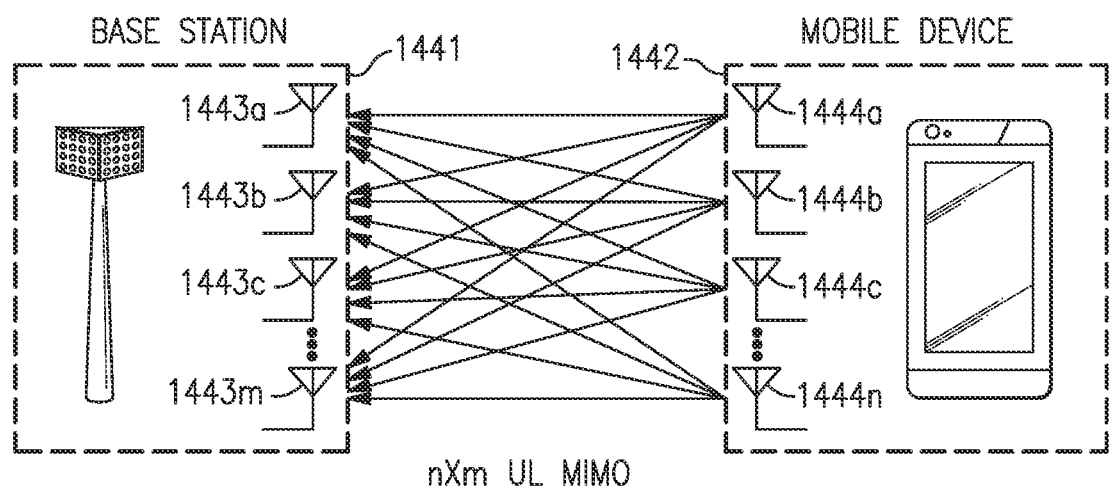
FIG. 14A is a schematic diagram of one example of an uplink channel using multi-input and multi-output (MIMO) communications.

FIG. 14A is a schematic diagram of one example of an uplink channel using multi-input and multi-output (MIMO) communications. Power amplifiers disclosed herein can be implemented in MIMO communications applications.

MIMO communications use multiple antennas for simultaneously communicating multiple data streams over common frequency spectrum. In certain implementations, the data streams operate with different reference signals to enhance data reception at the receiver. MIMO communications benefit from higher SNR, improved coding, and/or reduced signal interference due to spatial multiplexing differences of the radio environment.

MIMO order refers to a number of separate data streams sent or received. For instance, MIMO order for uplink communications can be described by a number of transmit antennas of UE, such as a mobile device, and a number of receive antennas of a base station. For example, 2×2 UL MIMO refers to MIMO uplink communications using two UE antennas and two base station antennas. Additionally, 4×4 UL MIMO refers to MIMO uplink communications using four UE antennas and four base station antennas.

In the example shown in FIG. 14A, uplink MIMO communications are provided by transmitting using N antennas 1444a, 1444b, 1444c, . . . 1444n of the mobile device 1442 and receiving using M antennas 1443a, 1443b, 1443c, . . . 1443m of the base station 1441. Accordingly, FIG. 14A illustrates an example of n×m UL MIMO.

By increasing the level or order of MIMO, bandwidth of an uplink channel and/or a downlink channel can be increased.

MIMO communications are applicable to communication links of a variety of types, such as FDD communication links and TDD communication links.

Figure 14B:
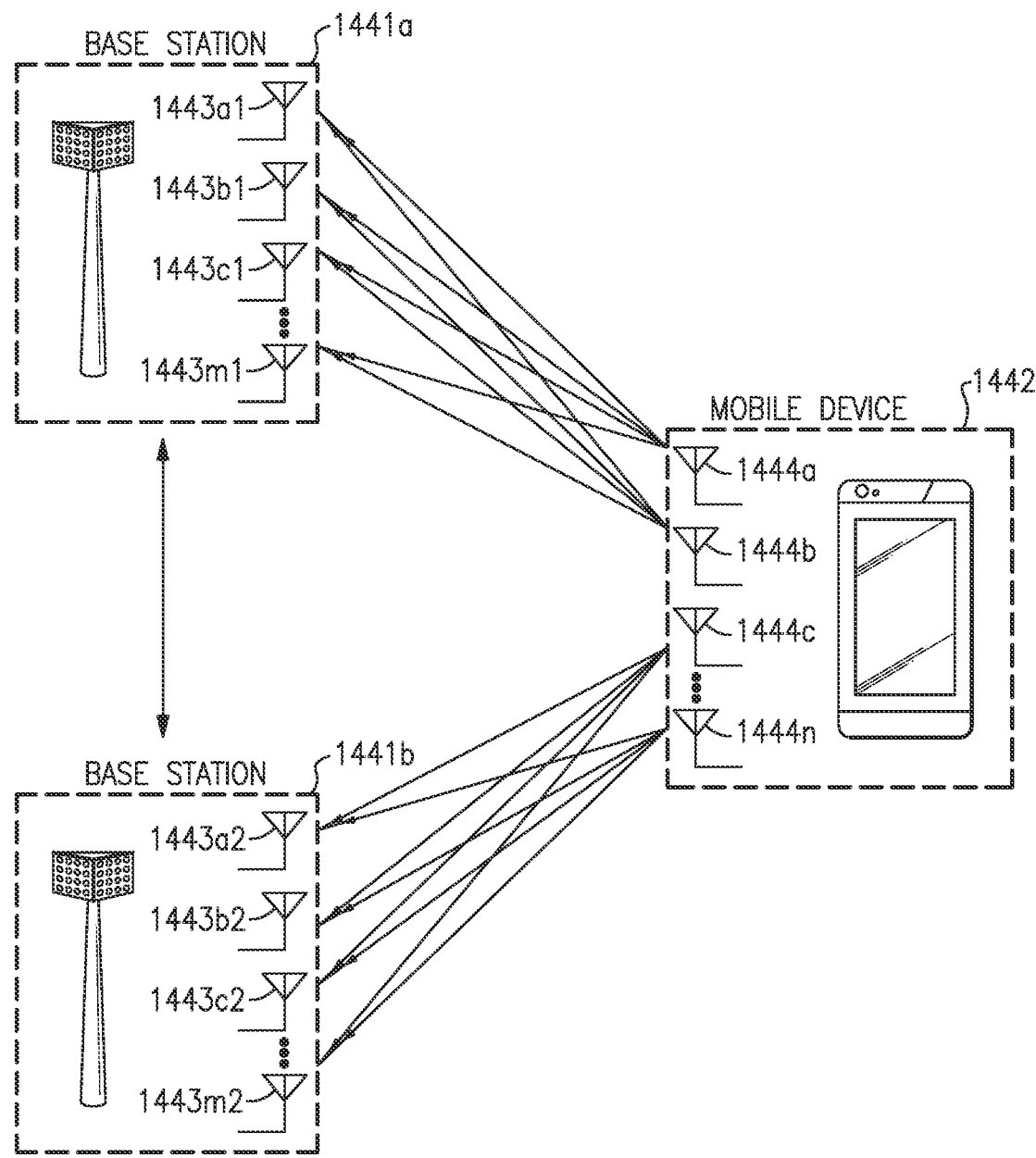
FIG. 14B is schematic diagram of another example of an uplink channel using MIMO communications.

FIG. 14B is schematic diagram of another example of an uplink channel using MIMO communications. In the example shown in FIG. 14B, uplink MIMO communications are provided by transmitting using N antennas 1444a, 1444b, 1444c, . . . 1444n of the mobile device 1442. Additionally, a first portion of the uplink transmissions are received using M antennas 1443a1, 1443b1, 1443c1, . . . 1443m1 of a first base station 1441a, while a second portion of the uplink transmissions are received using M antennas 1443a2, 1443b2, 1443c2, . . . 1443m2 of a second base station 1441b. Additionally, the first base station 1441a and the second base station 1441b communicate with one another over wired, optical, and/or wireless links.

The MIMO scenario of FIG. 14B illustrates an example in which multiple base stations cooperate to facilitate MIMO communications.

Mobile Devices

The power amplifier systems disclosed herein can be included in wireless communication devices, such as mobile devices. A power amplifier system in accordance with any suitable principles and advantages disclosed herein can be implemented in any suitable wireless communication device. An example of such a wireless communication device will be discussed with reference to FIG. 15.

FIG. 15 is a schematic diagram of one embodiment of a mobile device 1500. The mobile device 1500 includes a baseband system 1501, a transceiver 1502, a front end system 1503, antennas 1504, a power management system 1505, a memory 1506, a user interface 1507, and a battery 1508.

The mobile device 1500 can be used communicate using a wide variety of communications technologies, including, but not limited to, 2G, 3G, 4G (including LTE, LTE-Advanced, and LTE-Advanced Pro), 5G NR, WLAN (for instance, Wi-Fi), WPAN (for instance, Bluetooth and ZigBee), WMAN (for instance, WiMax), and/or GPS technologies.

The transceiver 1502 generates RF signals for transmission and processes incoming RF signals received from the antennas 1504. It will be understood that various functionalities associated with the transmission and receiving of RF signals can be achieved by one or more components that are collectively represented in FIG. 15 as the transceiver 1502. In one example, separate components (for instance, separate circuits or dies) can be provided for handling certain types of RF signals.

The front end system 1503 aids in conditioning signals transmitted to and/or received from the antennas 1504. In the illustrated embodiment, the front end system 1503 includes antenna tuning circuitry 1510, power amplifiers (PAs) 1511, low noise amplifiers (LNAs) 1512, filters 1513, switches 1514, and signal splitting/combining circuitry 1515. However, other implementations are possible.

For example, the front end system 1503 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

In certain implementations, the mobile device 1500 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 1504 can include antennas used for a wide variety of types of communications. For example, the antennas 1504 can include antennas for transmitting and/or receiving signals associated with a wide variety of frequencies and communications standards.

In certain implementations, the antennas 1504 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 1500 can operate with beamforming in certain implementations. For example, the front end system 1503 can include amplifiers having controllable gain and phase shifters having controllable phase to provide beam formation and directivity for transmission and/or reception of signals using the antennas 1504. For example, in the context of signal transmission, the amplitude and phases of the transmit signals provided to the antennas 1504 are controlled such that radiated signals from the antennas 1504 combine using constructive and destructive interference to generate an aggregate transmit signal exhibiting beam-like qualities with more signal strength propagating in a given direction. In the context of signal reception, the amplitude and phases are controlled such that more signal energy is received when the signal is arriving to the antennas 1504 from a particular direction. In certain implementations, the antennas 1504 include one or more arrays of antenna elements to enhance beamforming.

The baseband system 1501 is coupled to the user interface 1507 to facilitate processing of various user input and output (I/O), such as voice and data. The baseband system 1501 provides the transceiver 1502 with digital representations of transmit signals, which the transceiver 1502 processes to generate RF signals for transmission. The baseband system 1501 also processes digital representations of received signals provided by the transceiver 1502. As shown in FIG. 15, the baseband system 1501 is coupled to the memory 1506 of facilitate operation of the mobile device 1500.

The memory 1506 can be used for a wide variety of purposes, such as storing data and/or instructions to facilitate the operation of the mobile device 1500 and/or to provide storage of user information.

The power management system 1505 provides a number of power management functions of the mobile device 1500. In certain implementations, the power management system 1505 includes a PA supply control circuit that controls the supply voltages of the power amplifiers 1511. For example, the power management system 1505 can be configured to change the supply voltage(s) provided to one or more of the power amplifiers 1511 to improve efficiency, such as power added efficiency (PAE).

As shown in FIG. 15, the power management system 1505 receives a battery voltage from the battery 1508. The battery 1508 can be any suitable battery for use in the mobile device 1500, including, for example, a lithium-ion battery.

Applications, Terminology, and Conclusion

Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes example embodiments, the teachings described herein can be applied to a variety of structures. Any of the principles and advantages discussed herein can be implemented in association with RF circuits configured to amplify and process signals having a frequency in a range from about 30 kHz to 300 GHz, such as in a frequency range from about 450 MHz to 8.5 GHz. Power amplifier systems disclosed herein can generate RF signals at frequencies within FR1 of a 5G NR specification.

Aspects of this disclosure can be implemented in various electronic devices. Examples of the electronic devices can include, but are not limited to, consumer electronic products, parts of the consumer electronic products such as packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a robot such as an industrial robot, an Internet of things device, a stereo system, a digital music player, a radio, a camera such as a digital camera, a portable memory chip, a home appliance such as a washer or a dryer, a peripheral device, a wrist watch, a clock, etc. Further, the electronic devices can include unfinished products.

Unless the context indicates otherwise, throughout the description and the claims, the words "comprise," "comprising," "include," "including" and the like are to generally be construed in an inclusive sense, as opposed to an exclusive or exhaustive sense; that is to say, in the sense of "including, but not limited to." Conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively.

While certain embodiments have been described, these embodiments have been presented by way of example only, and are not intended to limit the scope of the disclosure. Indeed, the novel power amplifier systems, radio frequency front ends, wireless communication devices, and methods described herein may be embodied in a variety of other forms. Furthermore, various omissions, substitutions and changes in the form of the power amplifier systems, radio frequency front ends, wireless communication devices, and methods described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and/or acts of the various embodiments described above can be combined to provide further embodiments. The accompanying claims and their equivalents are intended to cover such forms or modifications as would fall within the scope and spirit of the disclosure.

What is claimed is:

1. A power amplifier system comprising:
a first power amplifier configured to amplify a first radio frequency input signal in a first mode and in a second mode to generate a radio frequency signal at an output, the radio frequency signal being associated with a different radio access technology in the first mode than in the second mode;
a second power amplifier configured to amplify a second radio frequency input signal in the first mode such that the first power amplifier and the second power amplifier are concurrently active in the first mode;
a switch configured to electrically connect the output of the first power amplifier to a first radio frequency signal path in the first mode and to electrically connect the output of the first power amplifier to a second radio frequency signal path in the second mode; and
a plurality of antennas including a first antenna and a second antenna, the first antenna configured to connect to the output of the first power amplifier by way of at least the switch and the first radio frequency signal path in the first mode, and the second antenna configured to connect to the output of the first power amplifier by way of at least the switch and the second radio frequency signal path in the second mode.

2. The power amplifier system of claim 1 wherein the first mode is a dual connectivity mode.

3. The power amplifier system of claim 1 wherein the first mode is a carrier aggregation mode.

4. The power amplifier system of claim 1 wherein the radio frequency signal is associated with a fourth generation technology in the first mode and a second generation technology in the second mode.

5. The power amplifier system of claim 1 wherein the radio frequency signal is associated with a fifth generation technology in the first mode and a second generation technology in the second mode.

6. The power amplifier system of claim 1 wherein the second power amplifier is configured to be inactive in the second mode.

7. The power amplifier system of claim 1 wherein the second mode is a second generation mode.

8. A wireless communication device arranged for multiple modes, the wireless communication device comprising:
a first power amplifier configured to amplify a first radio frequency input signal in a first mode and in a second mode to generate a first radio frequency signal at an output, the first radio frequency signal being associated with a different radio access technology in the first mode than in the second mode;
a second power amplifier configured to amplify a second radio frequency input signal in the second mode to generate a second radio frequency signal;
a switch configured to electrically connect the output of the first power amplifier to a first radio frequency signal path in the first mode and to electrically connect the output of the first power amplifier to a second radio frequency signal path in the second mode; and
a plurality of antennas including a first antenna and a second antenna, the first antenna configured to connect to the output of the first power amplifier by way of the first radio frequency signal path and the switch in the first mode, the second antenna configured to connect to the output of the first power amplifier by way of the second radio frequency signal path and the switch in the second mode, the first antenna configured to transmit the first radio frequency signal from the first power amplifier in the first mode, and the second antenna configured to transmit the second radio frequency signal from the second power amplifier in the first mode.

9. The wireless communication device of claim 8 wherein the first mode is a dual connectivity mode.

10. The wireless communication device of claim 8 wherein the first mode is a multiple-input multiple-output mode.

11. The wireless communication device of claim 8 wherein the first radio frequency signal is associated with a first radio access technology in the first mode, and the second radio frequency signal is associated with a second radio access technology in the first mode, the second radio access technology being different than the first radio access technology.

12. The wireless communication device of claim 8 wherein the first radio frequency signal is a Long Term Evolution signal in the first mode, and the first radio frequency signal is a second generation technology signal in the second mode.

13. The wireless communication device of claim 8 wherein the first radio frequency signal is a New Radio signal in the first mode, and the first radio frequency signal is a second generation technology signal in the second mode.

14. A method of generating radio frequency signals, the method comprising:
generating radio frequency signals in a first mode using a first power amplifier and a second power amplifier that are concurrently amplifying respective radio frequency input signals, the radio frequency signals including a first radio frequency signal generated by the first power amplifier and a second radio frequency signal generated by the second power amplifier, the first power amplifier having an output electrically connected to first antenna by way of a first signal path and a switch in the first mode;
electrically connecting the output of the first power amplifier to a second signal path for a second mode using the switch; and
amplifying, using the first power amplifier, a radio frequency input signal of the radio frequency input signals in the second mode, the output of the second power amplifier electrically connected to a second antenna by way of the second signal path and the switch in the second mode, the first power amplifier providing radio frequency signal amplification associated with a different radio access technology in the second mode than the first mode.

15. The method of claim 14 wherein the first mode is a dual connectivity mode, and the second mode is a second generation mode.

16. The method of claim 14 wherein the first radio frequency signal is a Long Term Evolution signal in the first mode, and the first radio frequency signal is a second generation technology signal in the second mode.

17. The method of claim 14 wherein the first radio frequency signal is a New Radio signal in the first mode, and the first radio frequency signal is a second generation technology signal in the second mode.

18. The method of claim 14 wherein the first mode is a multiple-input multiple-output mode.

19. The method of claim 14 wherein the first mode is a carrier aggregation mode.

20. The method of claim 14 wherein the second power amplifier is inactive in the second mode.

* * * * *

UNITED STATES PATENT AND TRADEMARK OFFICE
CERTIFICATE OF CORRECTION

PATENT NO. : 12,063,017 B2
APPLICATION NO. : 17/339735
DATED : August 13, 2024
INVENTOR(S) : Roman Zbigniew Arkiszewski et al.

Page 1 of 1

It is certified that error appears in the above-identified patent and that said Letters Patent is hereby corrected as shown below:

In the Claims

Column 25, Lines 11-12, Claim 1, delete "amplif ier" and insert -- amplifier --.

Column 26, Line 38 (approx.), Claim 14, delete "fora" and insert -- for a --.

Signed and Sealed this
Seventeenth Day of December, 2024

Derrick Brent
*Acting Director of the United States Patent and Trademark Office*